(12) United States Patent
Song et al.

(10) Patent No.: US 12,628,348 B2
(45) Date of Patent: May 12, 2026

(54) THREE-DIMENSIONAL FLASH MEMORY HAVING IMPROVED INTEGRATION DENSITY

(71) Applicant: IUCF-HYU (INDUSTRY-UNIVERSITY COOPERATION FOUNDATION HANYANG UNIVERSITY), Seoul (KR)

(72) Inventors: Yun Heub Song, Seoul (KR); Inho Nam, Seoul (KR)

(73) Assignee: IUCF-HYU (INDUSTRY-UNIVERSITY COOPERATION FOUNDATION HANYANG UNIVERSITY), Seoul (KR)

( * ) Notice: Subject to any disclaimer, the term of this patent is extended or adjusted under 35 U.S.C. 154(b) by 524 days.

(21) Appl. No.: 18/005,929

(22) PCT Filed: Jul. 5, 2021

(86) PCT No.: PCT/KR2021/008499
§ 371 (c)(1),
(2) Date: Jan. 18, 2023

(87) PCT Pub. No.: WO2022/019522
PCT Pub. Date: Jan. 27, 2022

(65) Prior Publication Data
US 2023/0276631 A1 Aug. 31, 2023

(30) Foreign Application Priority Data

| | | | |
|---|---|---|---|
| Jul. 24, 2020 | (KR) | .................... | 10-2020-0092124 |
| Aug. 25, 2020 | (KR) | .................... | 10-2020-0107043 |
| Aug. 28, 2020 | (KR) | .................... | 10-2020-0109573 |

(51) Int. Cl.
H10B 43/40 (2023.01)
G11C 16/08 (2006.01)
H10B 43/27 (2023.01)

(52) U.S. Cl.
CPC ............ H10B 43/40 (2023.02); G11C 16/08 (2013.01); H10B 43/27 (2023.02)

(58) Field of Classification Search
CPC . H01L 27/1027; H01L 27/1028; H10B 53/00; H10B 53/10; H10B 53/20;
(Continued)

(56) References Cited

U.S. PATENT DOCUMENTS

| | | | | |
|---|---|---|---|---|
| 10,141,326 B1 * | 11/2018 | Oh | .................... | H10B 43/40 |
| 2005/0006712 A1 * | 1/2005 | Ngo | .................... | H10B 69/00 |
| | | | | 438/257 |

(Continued)

FOREIGN PATENT DOCUMENTS

| | | | | |
|---|---|---|---|---|
| JP | 60-027160 A | 2/1985 | | |
| JP | 10256512 A | * 9/1998 | ............ | H01L 27/10 |

(Continued)

OTHER PUBLICATIONS

International Search Report for PCT/KR2021/008499 dated Oct. 28, 2021 [PCT/ISA/210].

*Primary Examiner* — William B Partridge
*Assistant Examiner* — Gustavo G Ramallo
(74) *Attorney, Agent, or Firm* — Sughrue Mion, PLLC

(57) ABSTRACT

The present invention relates to a three-dimension flash memory to which an efficient word line connection structure is applied, and a method for manufacturing same, wherein a plurality of word lines are connected to a low decoder respectively through contacts of the plurality of word lines, a plurality of connection wires, and plug vias of the plurality of word lines. The row decoder and a column decoder are
(Continued)

arranged to divide a plurality of peripheral circuit blocks such that the plurality of peripheral circuit blocks are symmetrical to each other in the plane of the three-dimensional flash memory. The three-dimension flash memory is configured in a buried type in which a common source line is buried in a substrate, in order to improve integration density.

9 Claims, 48 Drawing Sheets

(58) Field of Classification Search
CPC ........ H10B 53/30; H10B 53/40; H10B 53/50; H10B 41/00; H10B 41/10; H10B 41/20; H10B 41/23; H10B 41/27; H10B 41/30; H10B 41/35; H10B 41/40–44; H10B 41/46–50; H10B 41/60; H10B 41/70; H10B 43/00; H10B 43/10; H10B 43/20; H10B 43/23; H10B 43/27; H10B 43/30; H10B 43/35; H10B 43/40; H10B 43/50; H10B 51/00; H10B 51/10; H10B 51/20; H10B 51/30; H10B 51/40; H10B 51/50
See application file for complete search history.

(56) References Cited

U.S. PATENT DOCUMENTS

| | | | |
|---|---|---|---|
| 2014/0050020 A1* | 2/2014 | Lee ...................... | G11C 7/1081 |
| | | | 365/158 |
| 2017/0148800 A1* | 5/2017 | Nishikawa ............. | H10B 43/27 |
| 2017/0179154 A1* | 6/2017 | Furihata ............... | H10D 89/911 |
| 2020/0227347 A1 | 7/2020 | Oh | |

FOREIGN PATENT DOCUMENTS

| | | |
|---|---|---|
| JP | 2014-038686 A | 2/2014 |
| KR | 10-2012-0012728 A | 2/2012 |
| KR | 10-2012-0019654 A | 3/2012 |
| KR | 10-2017-0128670 A | 11/2017 |
| KR | 10-2018-0042358 A | 4/2018 |
| KR | 10-2019-0026418 A | 3/2019 |
| KR | 10-2019-0061376 A | 6/2019 |
| KR | 10-2020-0046833 A | 5/2020 |

* cited by examiner

<u>100</u>

<u>200</u>

FIG. 5
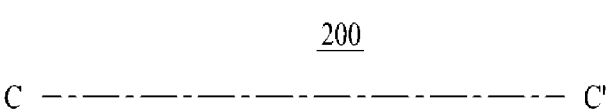
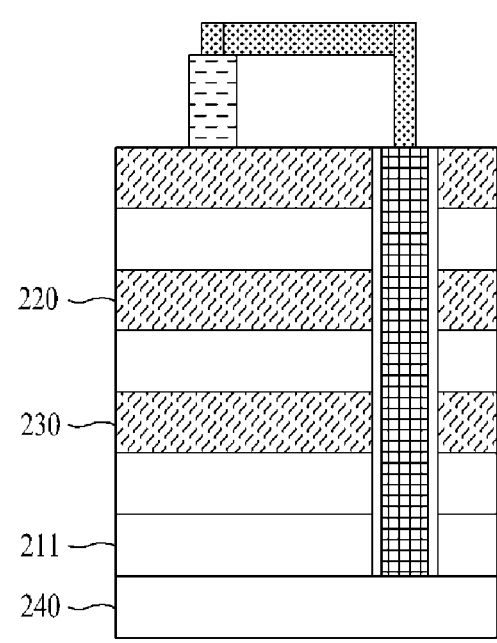
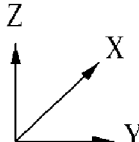

FIG. 9A
B —————————————————————————————— B'
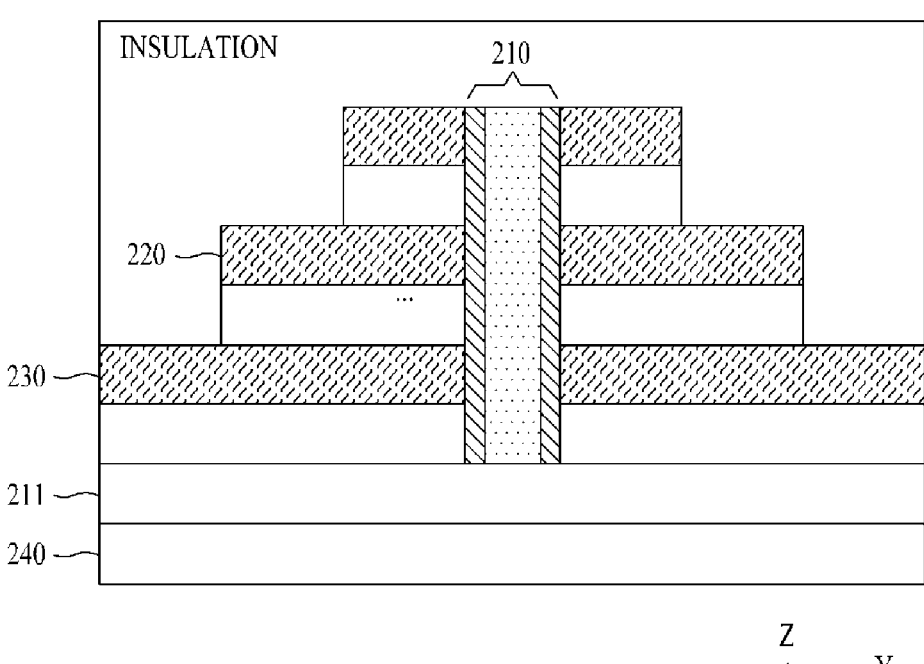
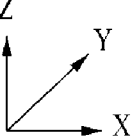

FIG. 10A
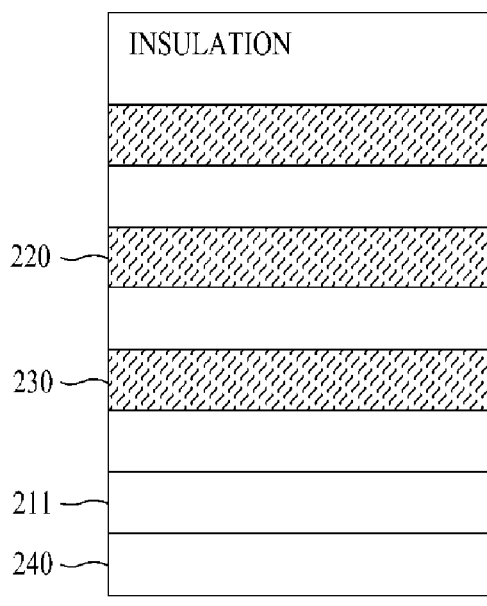
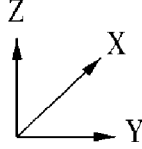

FIG. 10B
C — · — · — · — · — · — · — · — · — · — C'
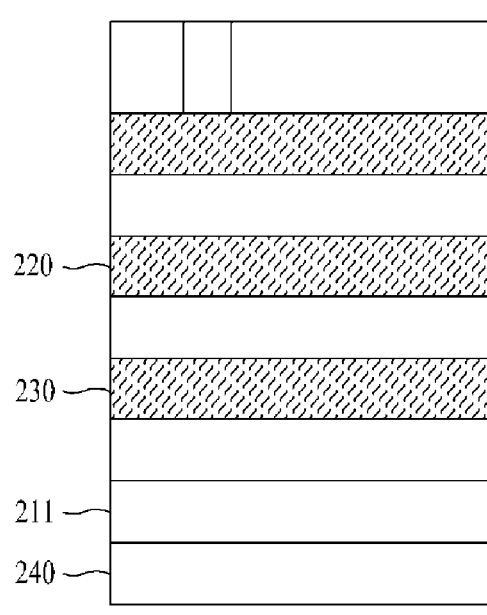
220
230
211
240
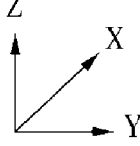

FIG. 10C
C —·—·—·—·—·—·—·—·—·—·—·— C'
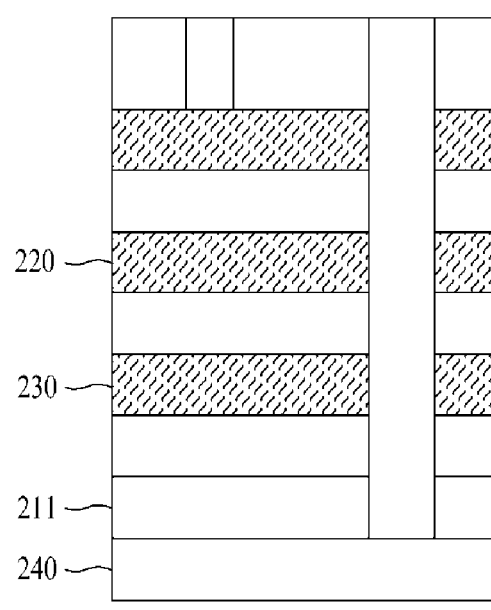
220
230
211
240
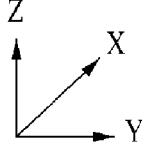

FIG. 10D
C — · — · — · — · — · — · — · — · — · — · — C'
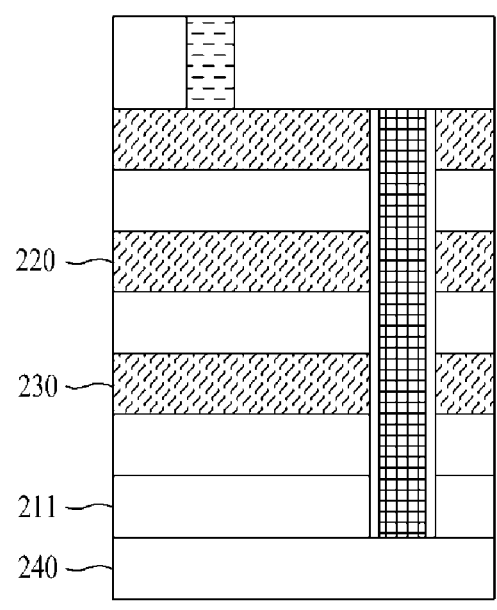
220
230
211
240
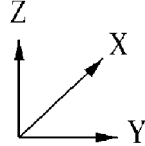

FIG. 10E
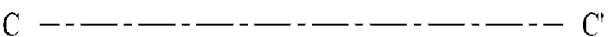
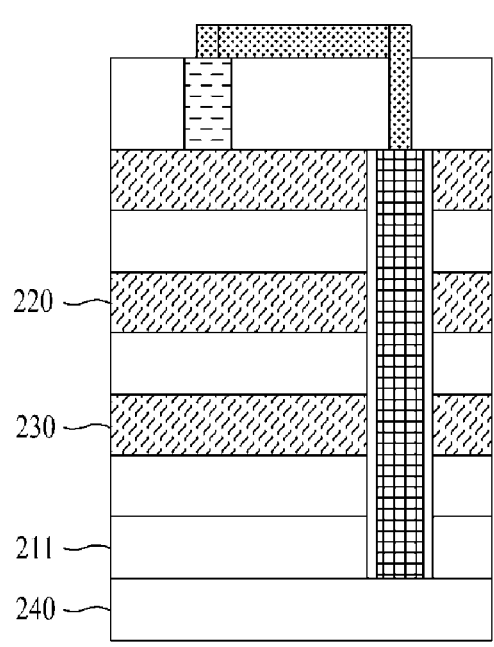
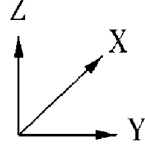

FIG. 12

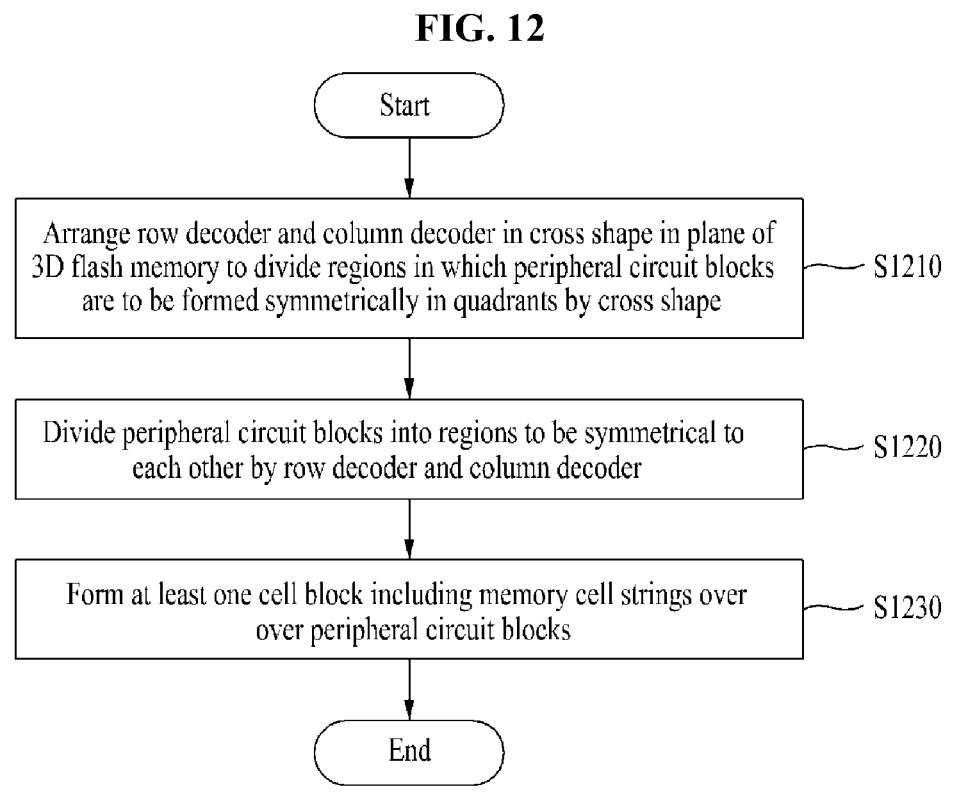

Start

↓

Arrange row decoder and column decoder in cross shape in plane of
3D flash memory to divide regions in which peripheral circuit blocks
are to be formed symmetrically in quadrants by cross shape — S1210

↓

Divide peripheral circuit blocks into regions to be symmetrical to
each other by row decoder and column decoder — S1220

↓

Form at least one cell block including memory cell strings over
over peripheral circuit blocks — S1230

↓

End

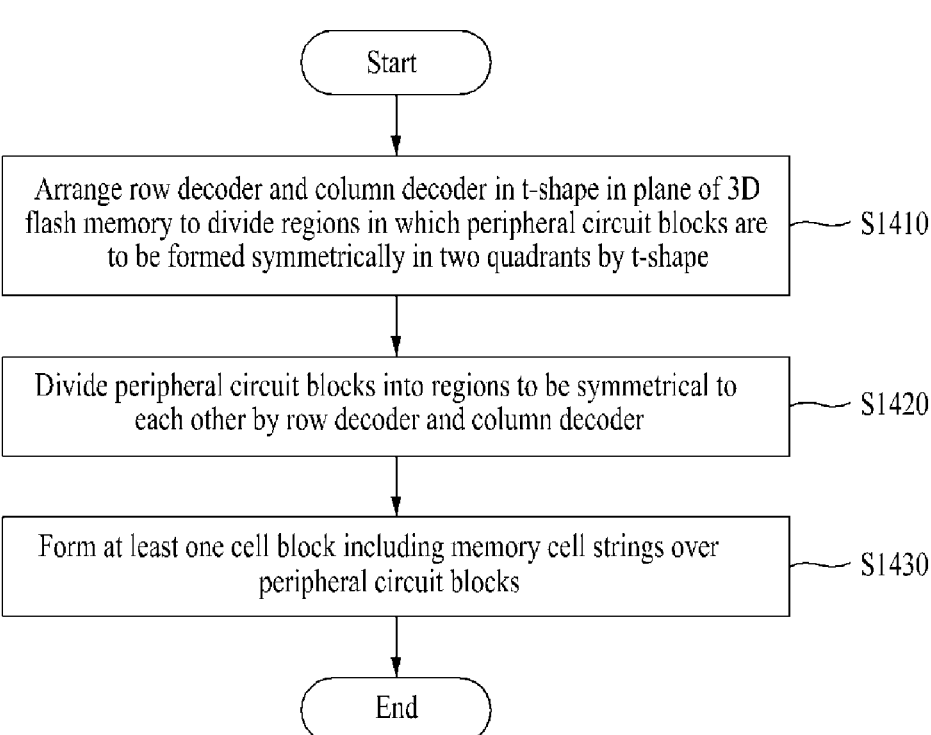

Start

Arrange row decoder and column decoder in t-shape in plane of 3D flash memory to divide regions in which peripheral circuit blocks are to be formed symmetrically in two quadrants by t-shape —— S1410

Divide peripheral circuit blocks into regions to be symmetrical to each other by row decoder and column decoder —— S1420

Form at least one cell block including memory cell strings over peripheral circuit blocks —— S1430

End

Figure 20:
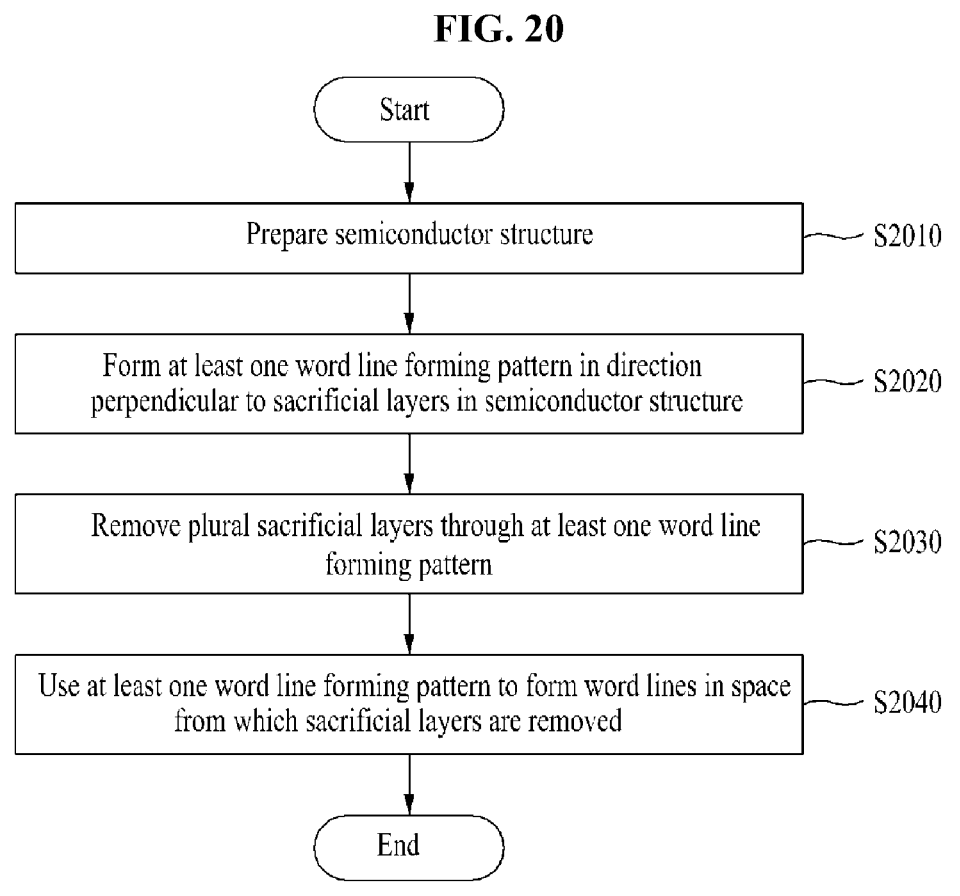

Start

↓

Prepare semiconductor structure — S2010

↓

Form at least one word line forming pattern in direction perpendicular to sacrificial layers in semiconductor structure — S2020

↓

Remove plural sacrificial layers through at least one word line forming pattern — S2030

↓

Use at least one word line forming pattern to form word lines in space from which sacrificial layers are removed — S2040

↓

End

THREE-DIMENSIONAL FLASH MEMORY HAVING IMPROVED INTEGRATION DENSITY

TECHNICAL FIELD

The following embodiments relate to a three-dimensional (3D) flash memory, and more particularly, to a technology for a 3D flash memory having improved integration.

BACKGROUND ART

Flash memory is an electrically erasable programmable read-only memory (EEPROM), which electrically controls inputs and outputs of data by Fowler-Nordheim tunneling or hot electron injection.

Recently, a three-dimensional (3D) structure is applied to a flash memory in which the degree of integration is increased by increasing the length of a memory cell string in a vertical direction in order to satisfy excellent performance and low price required by consumers. Referring to FIG. 1 illustrating such a conventional 3D flash memory, a 3D flash memory 100 has a structure that includes a channel layer 120 formed on a substrate 110 in a vertical direction, a charge storage layer 130 formed to surround the channel layer 120, a plurality of word lines 140 connected to the charge storage layer 130 and stacked in a horizontal direction, and a plurality of insulation layers 150 alternately interposed between the plurality of word lines 140. Hereinafter, the charge storage layer 130, the channel layer 120 and the plurality of word lines 140, which are components directly related to data storage and reading, may constitute a memory cell string.

Such a conventional 3D flash memory 100 may further include a row decoder 160 disposed below the plurality of word lines 140 to perform a selection operation on the plurality of word lines 140.

In the 3D flash memory 100 having such a structure, each of the plurality of word lines 140 is connected to the row decoder 160 through an outer wire 161 connected to a contact 141 of each of the plurality of word lines 140. Accordingly, because the outer wire 161 has a connection path that is out of plane of the plurality of word lines 140, the conventional 3D flash memory 100 may have a delayed operation speed, a low degree of integration, and a complicated layout structure.

Therefore, there is a need to propose a technique for solving the problems of the existing 3D flash memory 100.

Recently, a cell on peripheral (COP) structure in which at least one peripheral circuit is disposed on a substrate is applied to a flash memory.

Because the wire complexity of at least one peripheral circuit is increased due to such a structure, it is required to effectively lay out at least one peripheral circuit together with a row decoder and a column decoder.

Therefore, the following embodiments propose a 3D flash memory to which a structure for efficient layout is applied.

Referring to FIGS. 15A and 15B showing a conventional 3D flash memory, a 3D flash memory 1500 has a structure which includes a plurality of memory cell strings 120 including a channel layer 1521 extending from the substrate 1510 in one direction (e.g., Z direction which is a vertical direction) and a charge storage layer 1522 formed to surround the channel layer 1521, a plurality of word lines 1530 connected in a direction perpendicular to the plurality of memory cell strings 1520, and a common source line 1540 extending upwardly of the substrate 1510 as high as the plurality of memory cell strings 1520 to have a step difference.

In this case, as well as a function of a source electrode for the plurality of memory cell strings 1520, the common source line 1540 has a function of separating the plurality of word lines 1530 for each of the plurality of memory blocks 1521 and 1522 in which the plurality of memory cell strings 1520 are grouped in an arbitrary number, and a function of separating a string selection line (SSL) 1531 located on upper ends of the plurality of word lines 1530 in the plurality of memory blocks 1521 and 1522.

Meanwhile, because the common source line 1540 is formed to have a step difference on the substrate 1510 as described above, the conventional 3D flash memory has a high complexity of a source line manufacturing process and low cell integration.

Therefore, there is a need to propose a technique to solve the disadvantages of a conventional 3D flash memory by changing the structure of a source line while guaranteeing the functions of a common source line.

DETAILED DESCRIPTION OF THE INVENTION

Technical Problem

Embodiments of the present disclosure propose a 3D flash memory having a structure that is capable of minimizing the length of a connection path by arranging the connection path from a plurality of word lines to a row decoder in a plane of the plurality of word lines in order to prevent operation speed delay, improve integration and have a simple layout structure.

More specifically, embodiments of the present disclosure propose a 3D flash memory having a structure in which each of the plurality of word lines is connected to a row decoder through a contact of each of the plurality of word lines, a plurality of connection wires, and a plug via of each of the plurality of word lines.

Embodiments of the present disclosure propose a 3D flash memory to which a structure for efficient layout is applied and a method of manufacturing the same.

More specifically, embodiments of the present disclosure propose a 3D flash memory in which a row decoder and a column decoder are arranged to divide a plurality of peripheral circuit blocks such that the plurality of peripheral circuit blocks are symmetrical to each other in a plane of the 3D flash memory, thereby implementing a structure for efficient layout, and a method of manufacturing the same.

Embodiments of the present disclosure propose a 3D flash memory that reduces the complexity of a source line manufacturing process and improve cell integration in order to solve the disadvantages of a conventional 3D flash memory, and a method of manufacturing the same.

More specifically, embodiments of the present disclosure propose a 3D flash memory in which a common source line of a buried type is buried in a substrate, and a method of manufacturing the same.

Technical Solution

According one aspect of the present disclosure, a three-dimensional flash memory to which an efficient word line connection structure is applied, includes at least one memory cell string extending in one direction; a plurality of word lines vertically connected to the at least one memory cell string; and a row decoder located below the plurality of word lines, wherein each of the plurality of word lines is connected to the row decoder through a plug via connected to a contact of each of the plurality of word lines.

According to an embodiment, the plug via of each of the plurality of word lines may pass through each of the plurality of word lines on a plane of the plurality of word lines and contacts the row decoder.

According to an embodiment, the plug via of each of the plurality of word lines may have a structure that is isolated from each of the plurality of word lines on the plane.

According to an embodiment, the plug via of each of the plurality of word lines may be isolated from each of the plurality of word lines on a plane by an oxide layer formed between the plurality of word lines.

According to an embodiment, a plurality of connection wires connecting the plug via of each of the plurality of word lines to a contact of each of the plurality of word lines may be arranged in the plane of the plurality of word lines.

According another aspect of the present disclosure, a three-dimensional flash memory having a structure for efficient layout includes at least one cell block each including a plurality of memory cell strings extending on a substrate in one direction; a plurality of peripheral circuit blocks, each including at least one peripheral circuit and located below the at least one cell block as a cell on peripheral (COP) structure is applied; a row decoder for the at least one cell block and the plurality of peripheral circuit blocks; and a column decoder for the at least one cell block and the plurality of peripheral circuit blocks, wherein the row decoder and the column decoder are arranged while dividing the plurality of peripheral circuit blocks such that the plurality of peripheral circuit blocks are symmetrical to each other.

According to an embodiment, the row decoder and the column decoder may be arranged in a cross shape in a plane of the three-dimensional flash memory to symmetrically divide the plurality of peripheral circuit blocks into quadrants formed by the cross shape.

According to an embodiment, the row decoder and the column decoder may be arranged in the cross shape as the row decoder is located in a vertical direction and the column decoder is located in a horizontal direction across a midpoint of the row decoder in the plane of the 3D flash memory.

According to an embodiment, the row decoder and the column decoder may be arranged in a T-shape in a plane of the three-dimensional flash memory and symmetrically divide the plurality of peripheral circuit blocks into two quadrants formed by the T-shape.

According to an embodiment, the row decoder and the column decoder may be arranged in the T-shape as the column decoder is located in a horizontal direction and the row decoder is located in a vertical direction from a midpoint of the column decoder to one point in the plane of the three-dimensional flash memory.

According still another aspect of the present disclosure, a three-dimensional flash memory having improved integration includes a plurality of memory cell strings each including a channel layer and a charge storage layer extending in one direction on a substrate; a plurality of word lines connected in a direction perpendicular to the plurality of memory cell strings; at least one buried source line buried in the substrate; and at least one word line separation slit separating the plurality of word lines.

According to an embodiment, the at least one word line separation slit may extend in a direction perpendicular to the plurality of word lines such that parts separated from the plurality of word lines are spaced apart from each other by a plurality of memory blocks to separate the plurality of word lines, wherein the plurality of memory blocks are formed by grouping the plurality of memory cell strings in an arbitrary number.

According to an embodiment, the at least one word line separation slit may extend in a vertical direction by a depth of a region corresponding to the plurality of word lines.

According to an embodiment, the three-dimensional flash memory may further include at least one string selection line (SSL) separation slit separating at least one SSL located on upper ends of the plurality of word lines.

According to an embodiment, the at least one word line separation slit may be used as a passage through which a conductive material forming the plurality of word lines is inserted.

Advantageous Effects of the Invention

Embodiments of the present disclosure may propose a 3D flash memory having a structure that is capable of minimizing the length of a connection path by arranging the connection path from a plurality of word lines to a row decoder in a plane of the plurality of word lines in order to prevent operation speed delay, improve integration and have a simple layout structure.

More specifically, embodiments of the present disclosure may propose a 3D flash memory having a structure in which each of the plurality of word lines is connected to a row decoder through a contact of each of the plurality of word lines, a plurality of connection wires, and a plug via of each of the plurality of word lines.

Accordingly, embodiments may propose a 3D flash memory that prevents delay in operating speed, improves integration, and has a simple layout structure.

Embodiments of the present disclosure propose a 3D flash memory to which a structure for efficient layout is applied and a method of manufacturing the same.

More specifically, embodiments of the present disclosure may propose a 3D flash memory in which a row decoder and a column decoder are arranged to divide a plurality of peripheral circuit blocks such that the plurality of peripheral circuit blocks are symmetrical to each other in a plane of the 3D flash memory, thereby implementing a structure for efficient layout, and a method of manufacturing the same.

Embodiments of the present disclosure propose a 3D flash memory that reduces the complexity of a source line manufacturing process and improve cell integration, and a method of manufacturing the same, so that it is possible to solve the disadvantages of an existing 3D flash memory.

More specifically, embodiments of the present disclosure propose a 3D flash memory in which a common source line of a buried type is buried in a substrate, and a method of manufacturing the same.

Accordingly, embodiments propose a 3D flash memory in which a buried source line is connected to a memory cell string through a substrate and a manufacturing method thereof, so that wire connecting the source line to the memory cell string is eliminated, thereby simplifying the wire layout design.

DESCRIPTION OF THE DRAWINGS

FIG. 5 is a Y-Z cross-sectional view of the three-dimensional flash memory taken along line C-C' of FIG. 2.

FIGS. 9A to 9D are X-Z cross-sectional views illustrating a method of manufacturing a 3D flash memory through a B-B' cross section of the 3D flash memory shown in FIGS. 7A to 7E.

FIGS. 10A to 10E are Y-Z cross-sectional views illustrating a method of manufacturing a 3D flash memory through the C-C' cross section of the 3D flash memory shown in FIGS. 7A to 7E.

FIG. 12 is a flowchart illustrating a method of manufacturing a 3D flash memory according to an exemplary embodiment.

FIG. 13 is an X-Y plan view illustrating a 3D flash memory according to another embodiment.

FIG. 14 is a flowchart illustrating a method of manufacturing a 3D flash memory according to an embodiment.

FIG. 15B is an X-Z plan view illustrating a conventional 3D flash memory.

FIG. 16B is an X-Z cross-sectional view illustrating a 3D flash memory according to an embodiment.

FIGS. 18A to 18F are X-Z cross-sectional views illustrating a method of manufacturing a 3D flash memory according to an embodiment.

FIG. 19A is an X-Y plan view illustrating a 3D flash memory according to another embodiment.

FIG. 19B is an X-Z cross-sectional view illustrating a 3D flash memory according to another embodiment.

FIG. 20 is a flowchart illustrating a method of manufacturing a 3D flash memory according to another embodiment.

FIGS. 21A to 21F are X-Z cross-sectional views illustrating a method of manufacturing a 3D flash memory according to another embodiment.

BEST MODE

Figure 1:
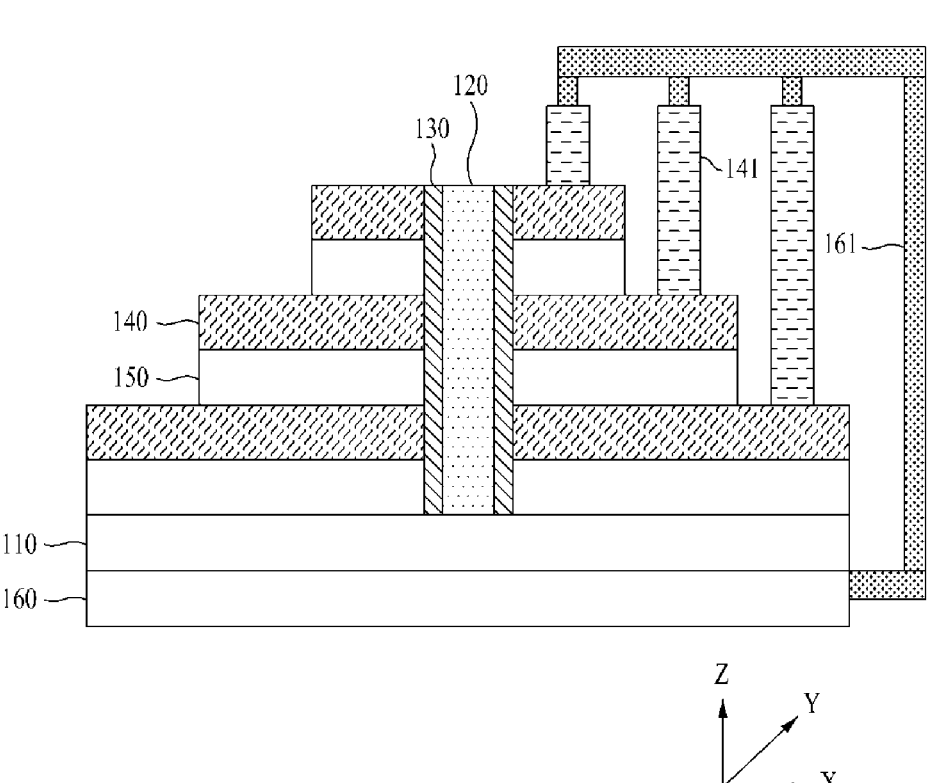
FIG. 1 is an X-Z plan view showing a three-dimensional (3D) flash memory according to the related art.

Hereinafter embodiments of the present disclosure will be described in detail with reference to the accompanying drawings. However, it should be understood that the present disclosure is not limited to the following embodiments. In addition, the same reference numerals used in each drawing represent the same elements.

In addition, terminologies used herein are defined to appropriately describe the exemplary embodiments of the present disclosure and thus may be changed depending on a viewer, the intent of an operator, or a custom. Accordingly, the terminologies must be defined based on the following overall description of the present disclosure.

Figure 2:
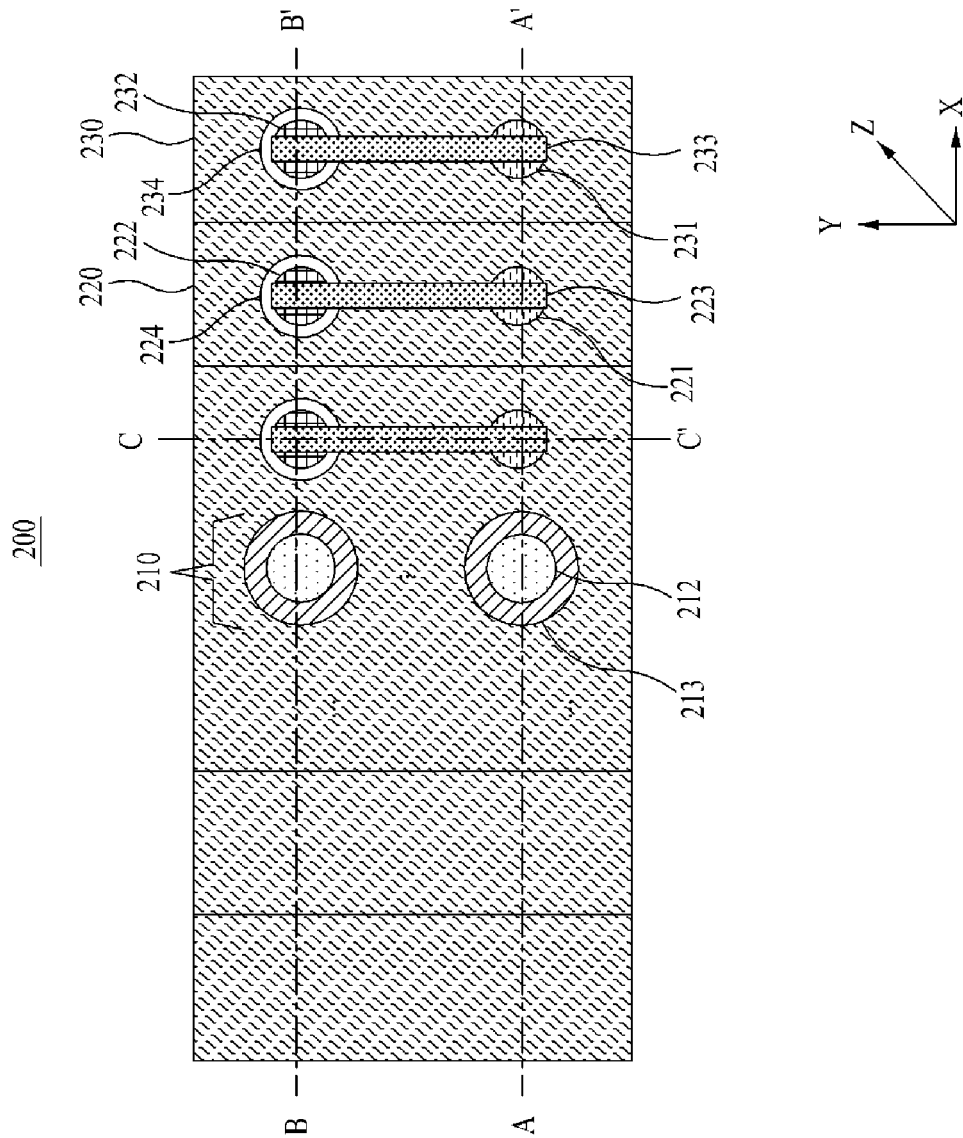
FIG. 2 is an X-Y plan view showing a three-dimensional (3D) flash memory according to an embodiment.
Figure 3:
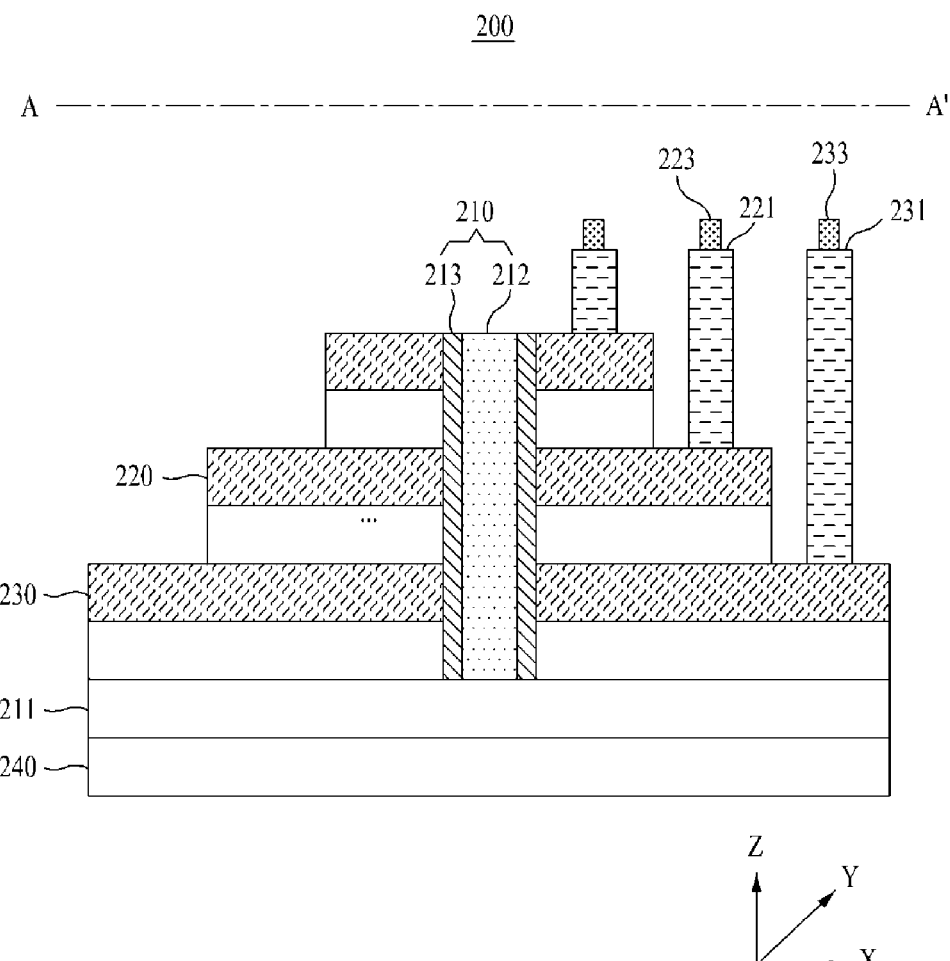
FIG. 3 is an X-Z cross-sectional view of the three-dimensional flash memory taken along line A-A' of FIG. 2.
Figure 4:
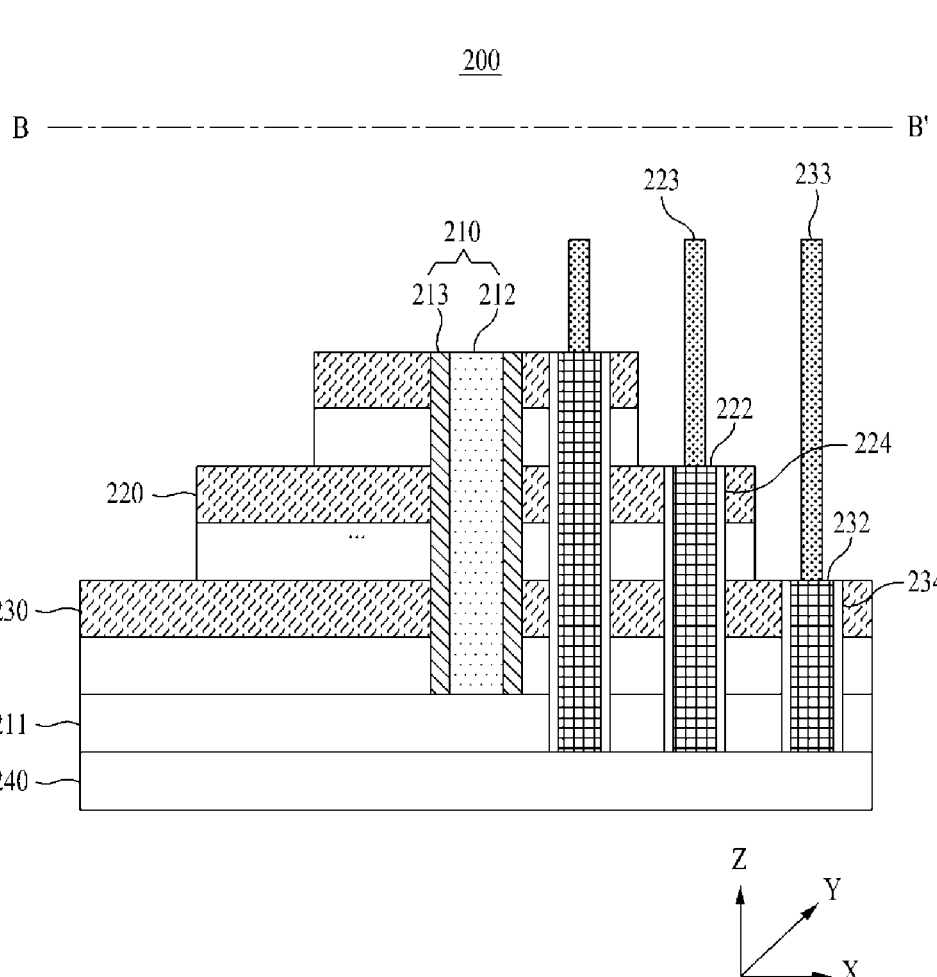
FIG. 4 is an X-Z cross-sectional view of the three-dimensional flash memory taken along line B-B' of FIG. 2.

FIG. 2 is an X-Y plan view showing a three-dimensional (3D) flash memory according to an embodiment. FIG. 3 is an X-Z cross-sectional view of the three-dimensional flash memory taken along line A-A' of FIG. 2. FIG. 4 is an X-Z cross-sectional view of the three-dimensional flash memory taken along line B-B' of FIG. 2. FIG. 5 is a Y-Z cross-sectional view of the three-dimensional flash memory taken along line C-C' of FIG. 2.

Referring to FIGS. 2 to 5, a 3D flash memory 200 according to an embodiment may include at least one memory cell string 210, a plurality of word lines 220 and 230, and a row decoder 240.

The at least one memory cell string 210 may extend on a substrate 211 in one direction (e.g., Z direction), and may include a channel layer 212 and a charge storage layer 213 surrounding the channel layer 212. The channel layer 212 may be formed of monocrystalline silicon or poly-silicon. The charge storage layer 213, which is a component for storing charge from current flowing through the plurality of word lines 220 and 230, may be formed, for example, in a structure of oxide-nitride-oxide (ONO). Hereinafter, each of the at least one memory cell string 210 will be described as including only vertical elements extending in one direction (e.g., Z direction) orthogonal to the substrate 211, but is not limited thereto, and a horizontal element (not shown) of the charge storage layer 213 parallel with the substrate 211 may be further included.

The row decoder 240 is disposed below the plurality of word lines 220 and 230 and may perform a selection operation for the plurality of word lines 220 and 230. Because the function and arrangement position of the row decoder 240 are the same as those of the conventionally known row decoder, a detailed description thereof will be omitted.

The plurality of word lines 220 and 230 may be formed of a conductive material such as tungsten (W), titanium (Ti), tantalum (Ta), copper (Cu), or gold (Au) to perform functions of word lines. Portions of the plurality of word lines 220 and 230 may have a stepped shape for connection with the row decoder 240, and the plurality of word lines 220 and 230 may include contacts 221 and 231 formed on the stepped shape, respectively.

Specifically, the plurality of word lines 220 and 230 according to an embodiment are connected to the row decoder 240 through plug vias 222 and 232 connected to the contacts 221 and 231.

In more detail, as the plug vias 222 and 232 of the plurality of word lines 220 and 230 contact the row decoder 240, the contacts 221 and 231 of the plurality of word lines 220 and 230 are connected to the plug vias 222 and 232 of the plurality of word lines 220 and 230 through the plurality of connection wires 223 and 233, respectively, so that the plurality of word lines 220 and 230 may be connected to the row decoder 240 through the contacts 221 and 231, connection wires 223 and 233 and plug vias 222 and 232.

In this case, as well as the contacts 221 and 231 and plug vias 222 and 232 of the plurality of word lines 220 and 230, the plurality of connection wires 223 and 233 may be arranged in the plane of the plurality of word lines 220 and 230, so that the connection path from the plurality of word lines 220 and 230 to the row decoder 240 does not leave the plane of the plurality of word lines 220 and 230 and has a short distance.

Furthermore, the locations of the plug vias 222 and 232 and the contacts 221 and 231 of the plurality of word lines 220 and 230 formed on the plane may be adjusted to minimize the lengths 223-1 and 233-1 of the plurality of connection wires 223 and 233, so that the connection path from the plurality of word lines 220 and 230 to the row decoder 240 has the shortest distance.

In this case, the plug vias 222 and 232 of the plurality of word lines 220 and 230 are components that pass through the plurality of word lines 220 and 230 in the plane of the plurality of word lines 220 and 230 to contact the row decoder 240, which are structured to be isolated from the plurality of word lines 220 and 230 on the plane, respectively. For example, the plug vias 222 and 232 of the plurality of word lines 220 and 230 may be isolated from the plurality of word lines 220 and 230 on the plane by oxide layers 224 and 234 formed between the plurality of word lines 220 and 230, respectively.

As described above, the 3D flash memory 200 according to an embodiment may have a structure in which the plurality of word lines 220 and 230 are connected to the row decoder 240 through the contacts 221 and 231 of the plurality of word lines 220 and 230, the plurality of connection wires 223 and 233 and the plug vias 222 and 232 of the plurality of word lines 220 and 230 and the connection path is arranged in the plane of the plurality of word lines 220 and 230 to minimize the length, so that it is possible to prevent delay in operating speed, improve the degree of integration, and simplify the layout structure.

Hereinafter, a process of manufacturing the 3D flash memory 200 will be described with reference to FIGS. 6 to 10E.

Figure 6:
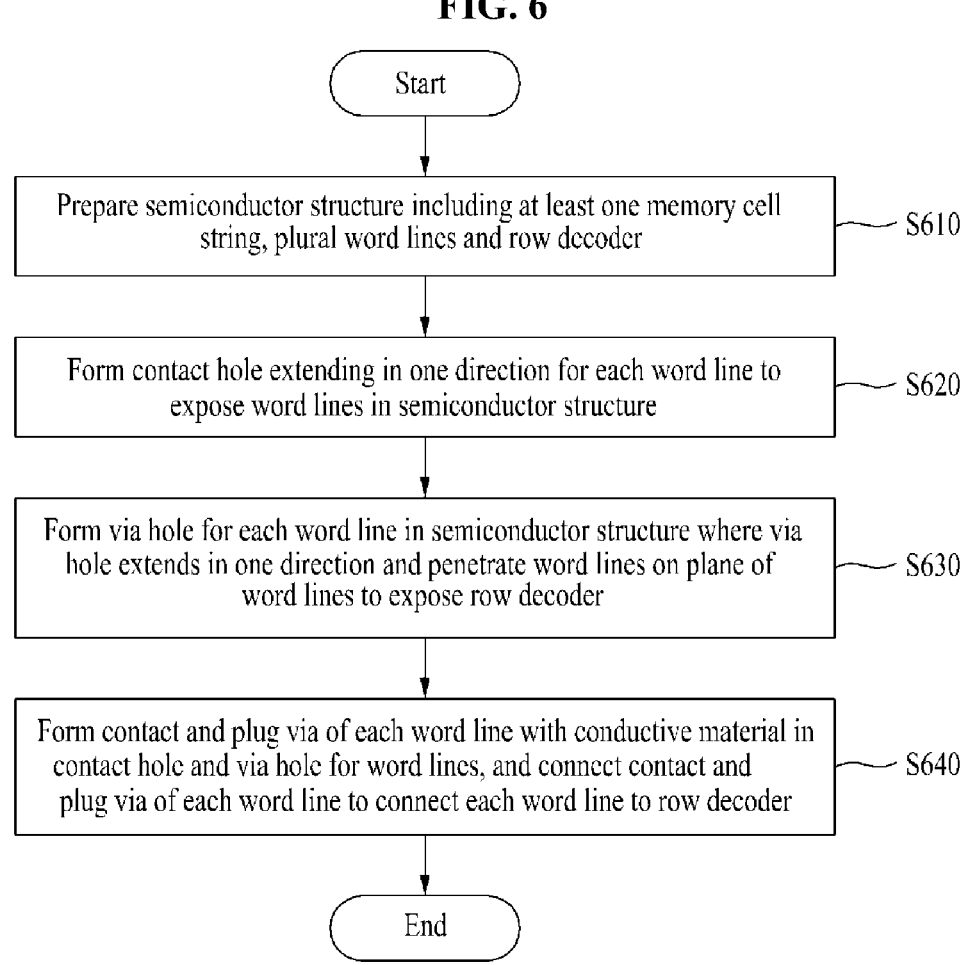
FIG. 6 is a flowchart illustrating a method of manufacturing a 3D flash memory according to an embodiment.

FIG. 6 is a flowchart illustrating a method of manufacturing a 3D flash memory according to an embodiment. FIGS. 7A to 7E are X-Y plan views illustrating a method of manufacturing a 3D flash memory according to an embodiment. FIGS. 8A to 8D are X-Z cross-sectional views illustrating a method of manufacturing a 3D flash memory through an A-A' cross section of the three-dimensional flash memory shown in FIGS. 7A to 7E. FIGS. 9A to 9D are X-Z cross-sectional views illustrating a method of manufacturing a 3D flash memory through a B-B' cross section of the 3D flash memory shown in FIGS. 7A to 7E. FIGS. 10A to 10E are Y-Z cross-sectional views illustrating a method of manufacturing a 3D flash memory through the C-C' cross section of the 3D flash memory shown in FIGS. 7A to 7E. Hereinafter, the manufacturing method described below is for manufacturing the 3D flash memory 200 described in FIG. 2, and is assumed to be performed by an automated and mechanized manufacturing system.

Referring to FIG. 6, in operation S610, the manufacturing system prepares a semiconductor structure that includes the at least one memory cell string 210 extending on the substrate 211 in one direction as shown in FIGS. 7A, 8A, 9A and 10A, the plurality of word lines 220 and 230 vertically connected to the at least one memory cell string 210, and the row decoder 240 located below the plurality of word lines 220 and 230.

In this case, an upper insulation layer is formed over the semiconductor structure, and for convenience of description, the upper insulation layer is not shown in FIGS. 7A to 7E.

Figure 7A:
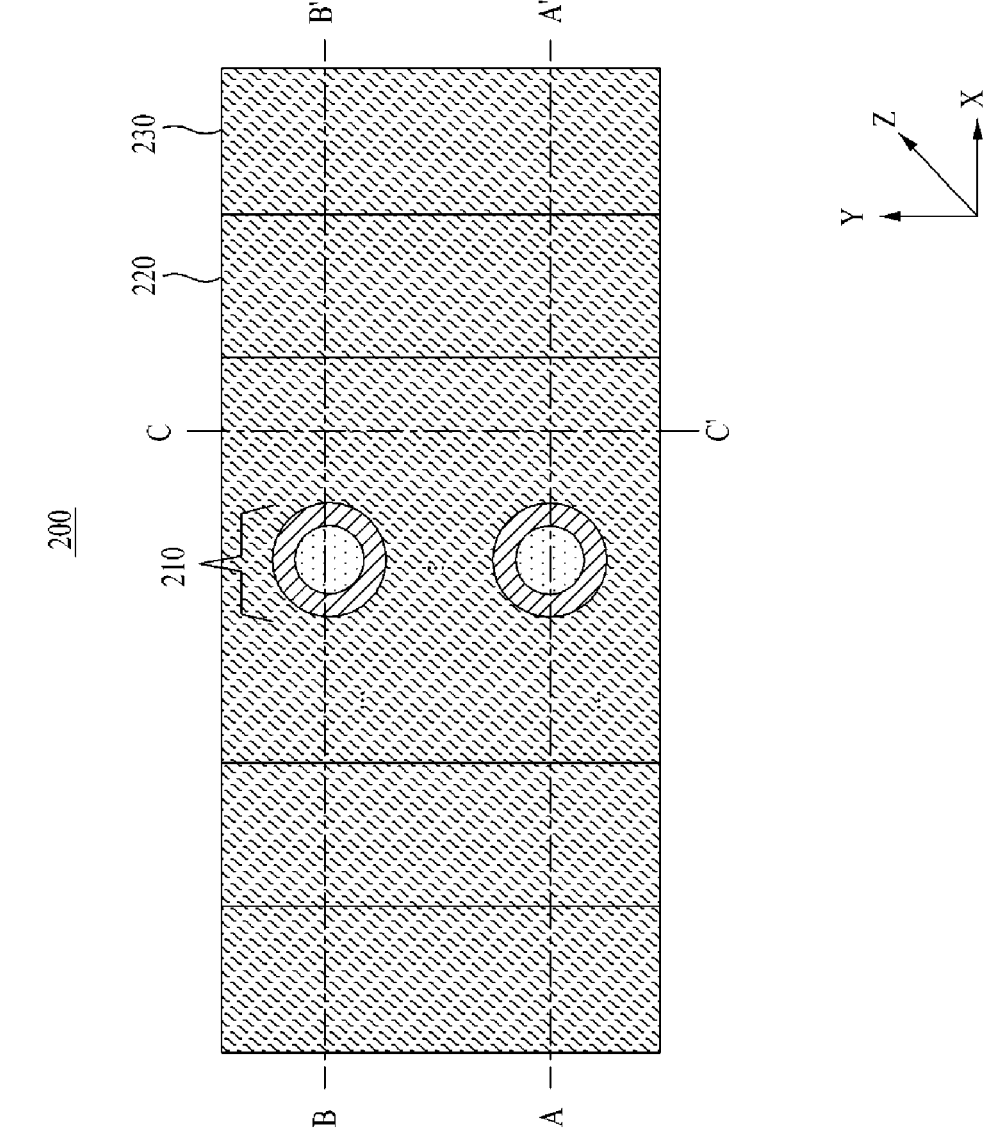
FIGS. 7A to 7E are X-Y plan views illustrating a method of manufacturing a 3D flash memory according to an embodiment.
Figure 7B:
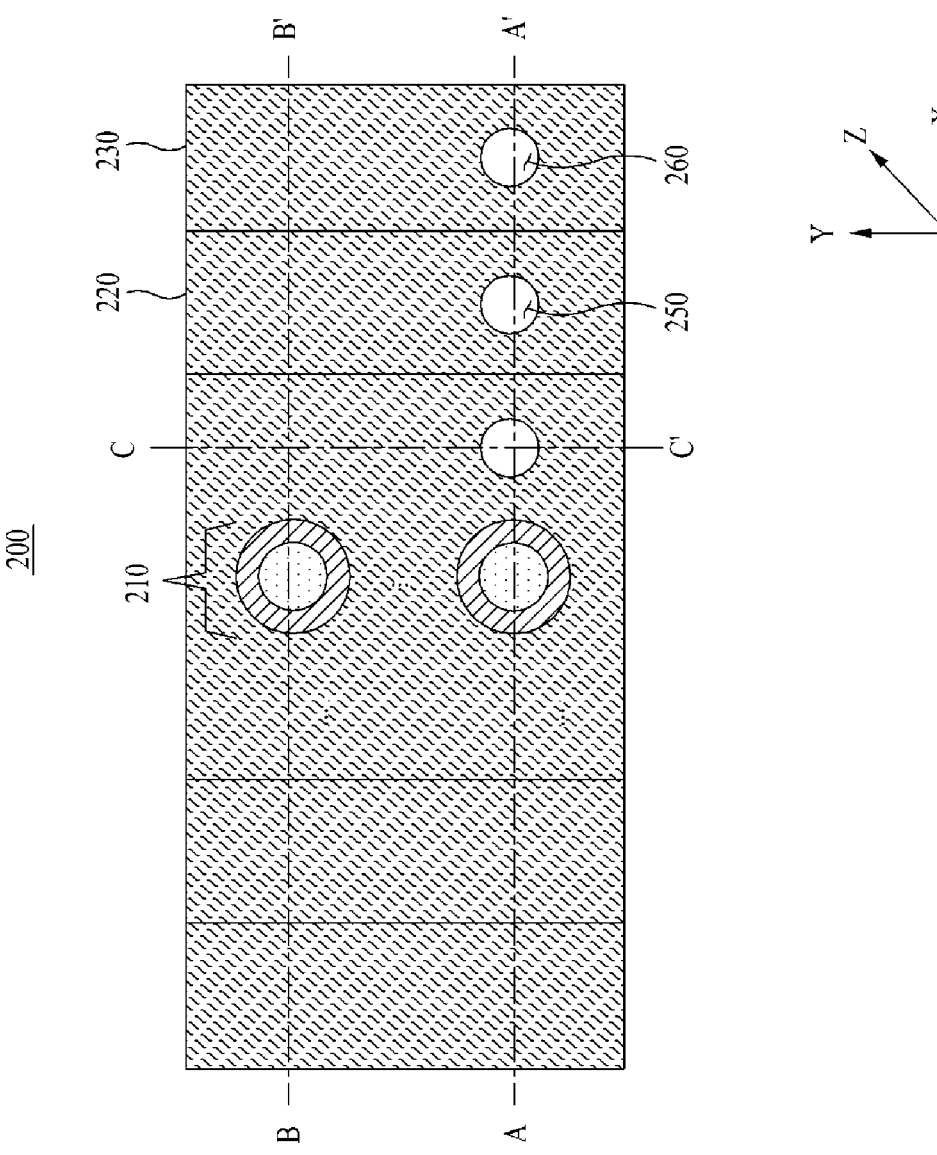
Figure 8A:
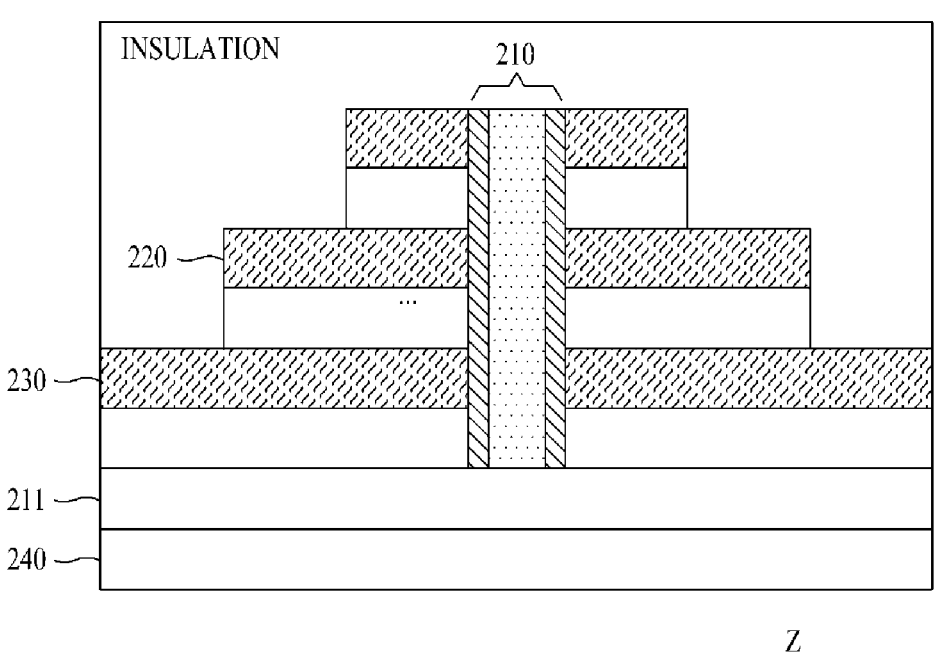
FIGS. 8A to 8D are X-Z cross-sectional views illustrating a method of manufacturing a 3D flash memory through an A-A' cross section of the three-dimensional flash memory shown in FIGS. 7A to 7E.
Figure 8B:
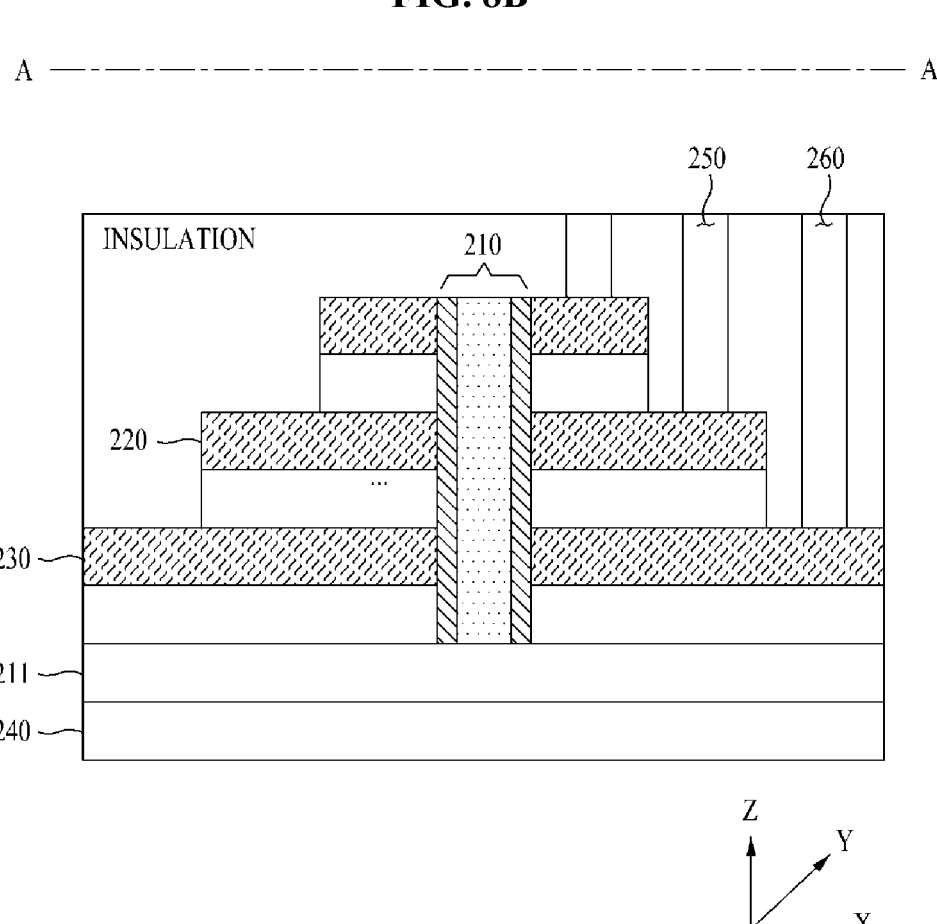
Figure 8C:
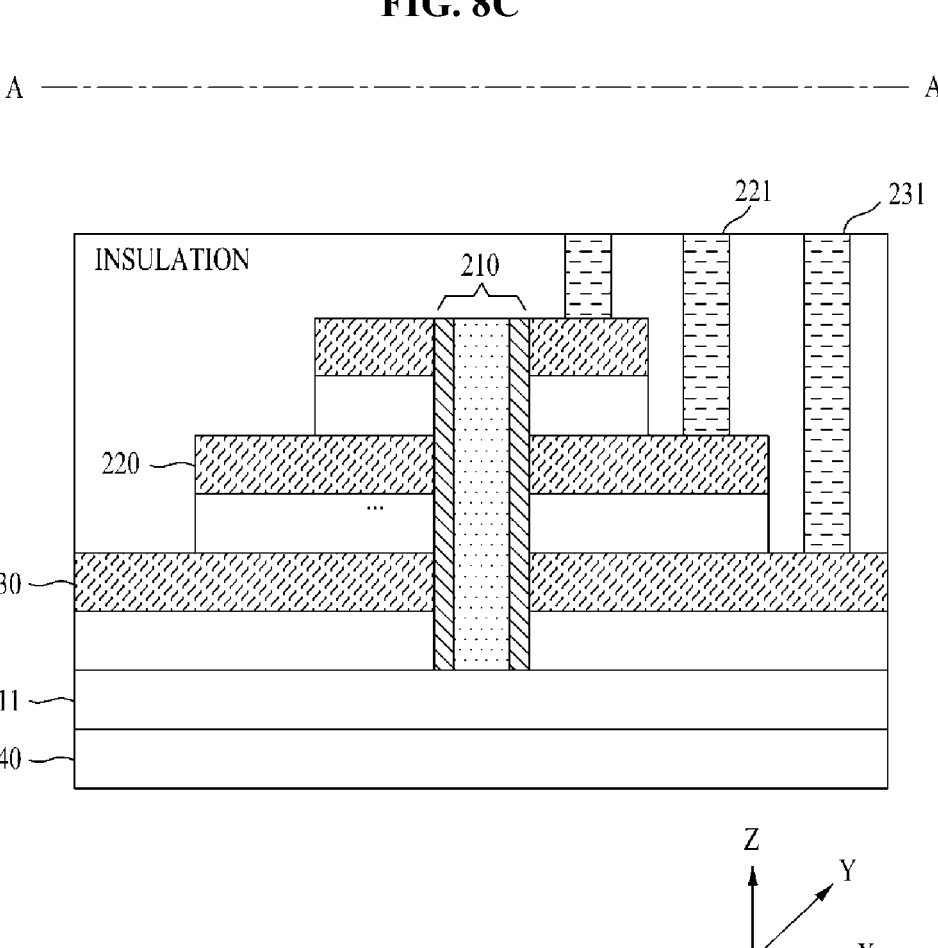
Figure 8D:
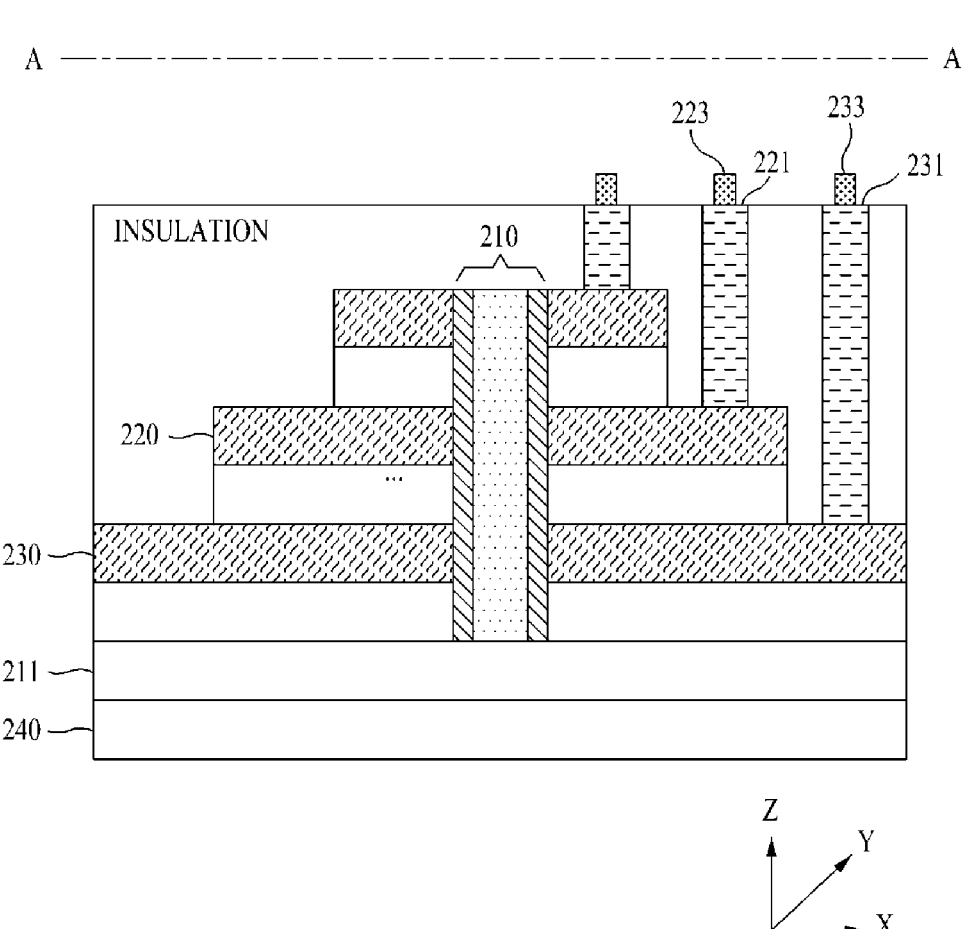

Then, in operation S620, as shown in FIGS. 7B, 8B and 10B, the manufacturing system forms contact holes 250 and 260 extending in one direction for the plurality of word lines 220 and 230 to expose the plurality of word lines 220 and 230 in the semiconductor structure.

Figure 7C:
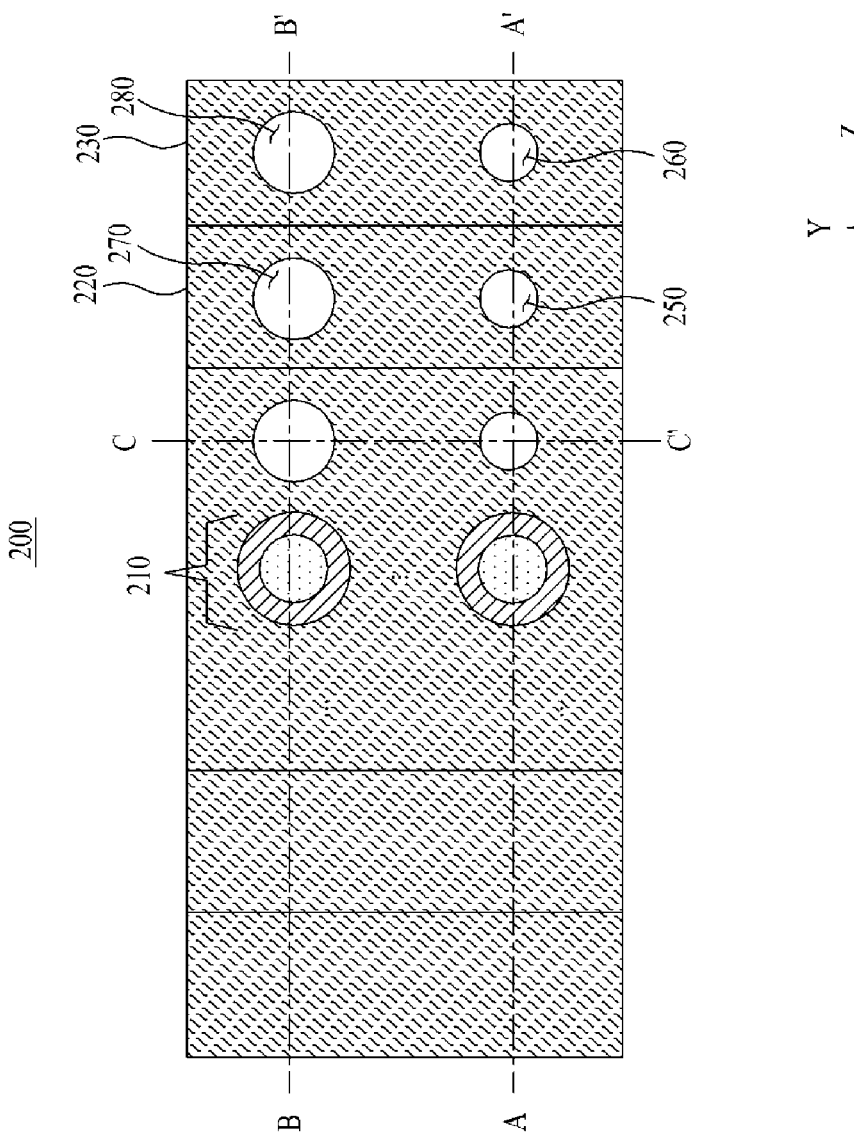
Figure 7D:
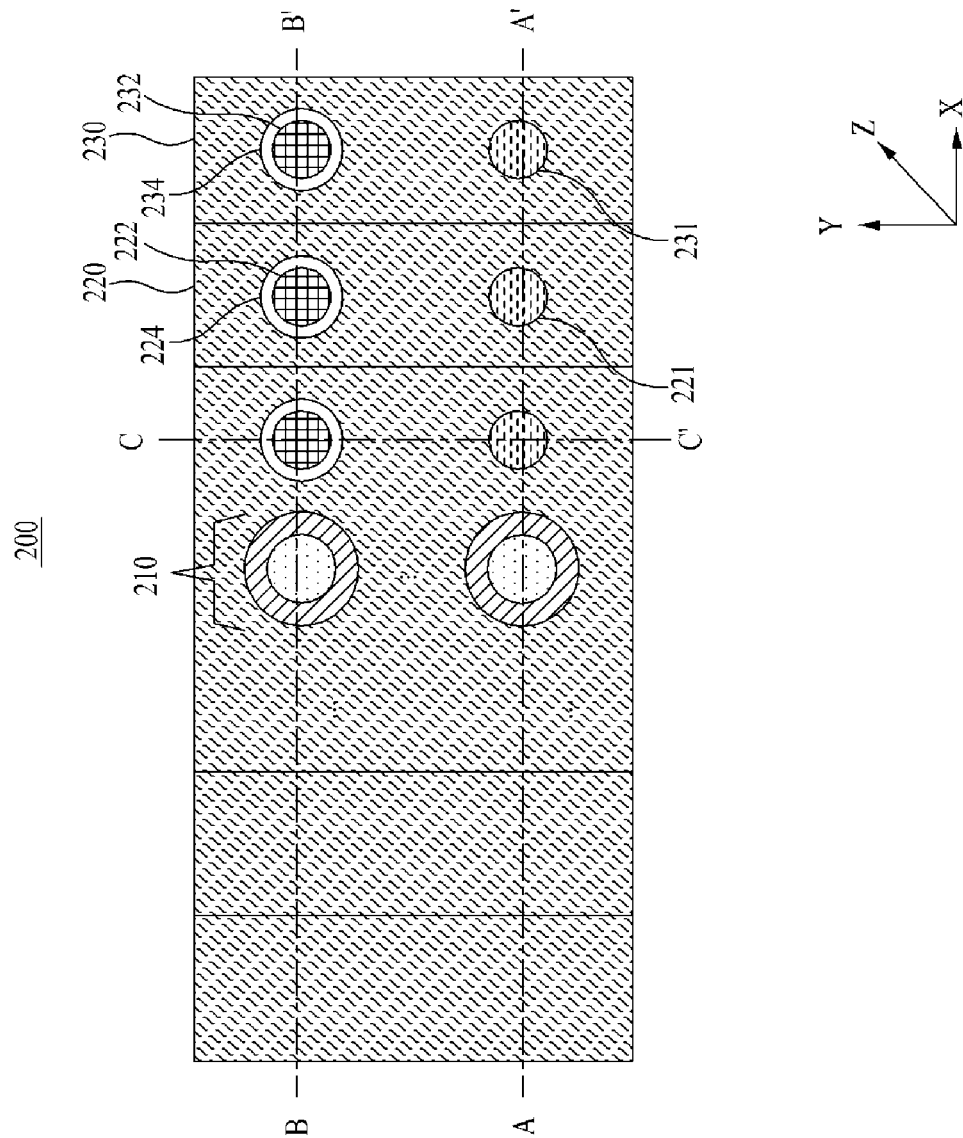
Figure 7E:
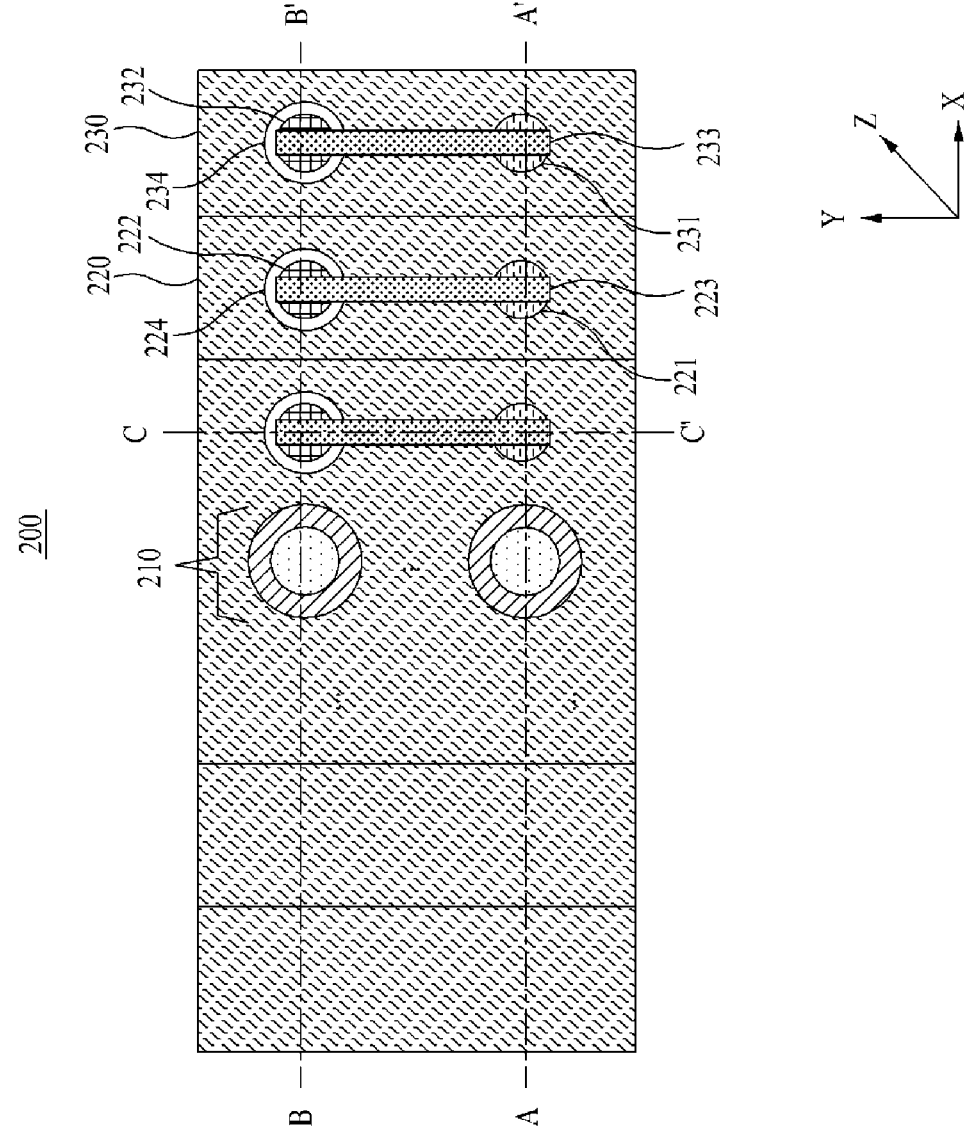
Figure 9B:
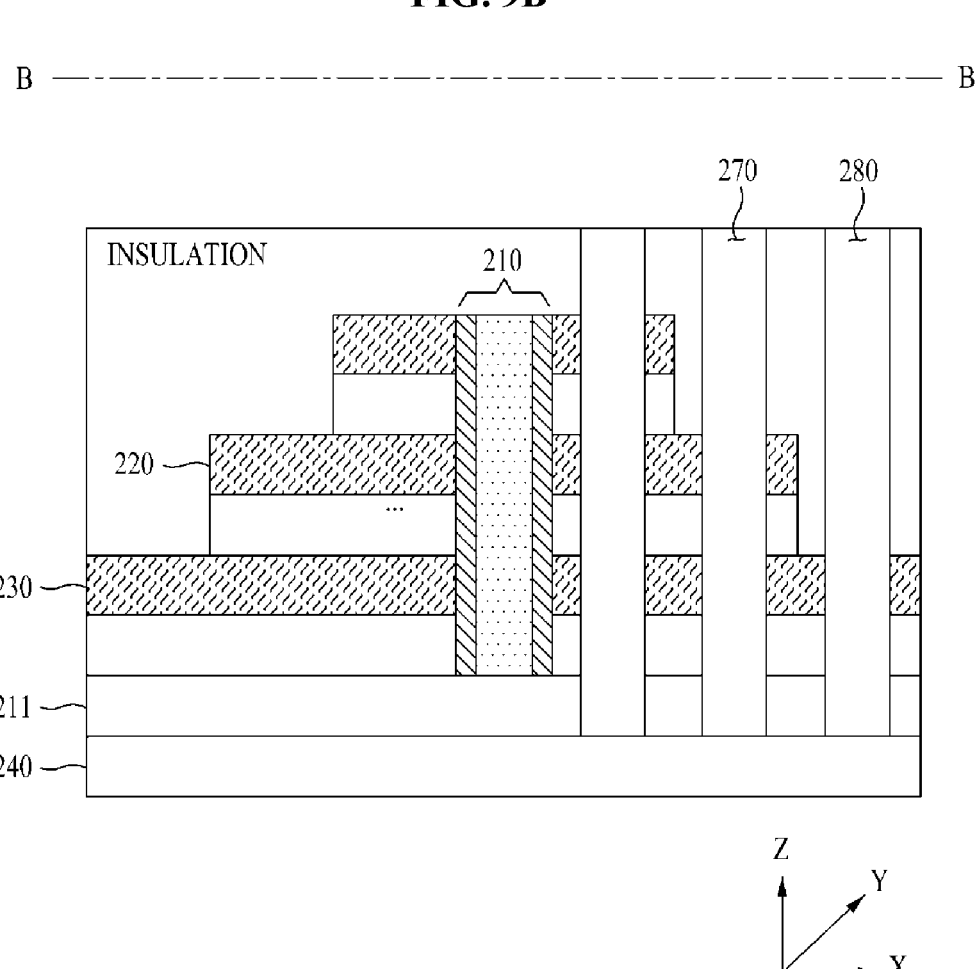
Figure 9C:
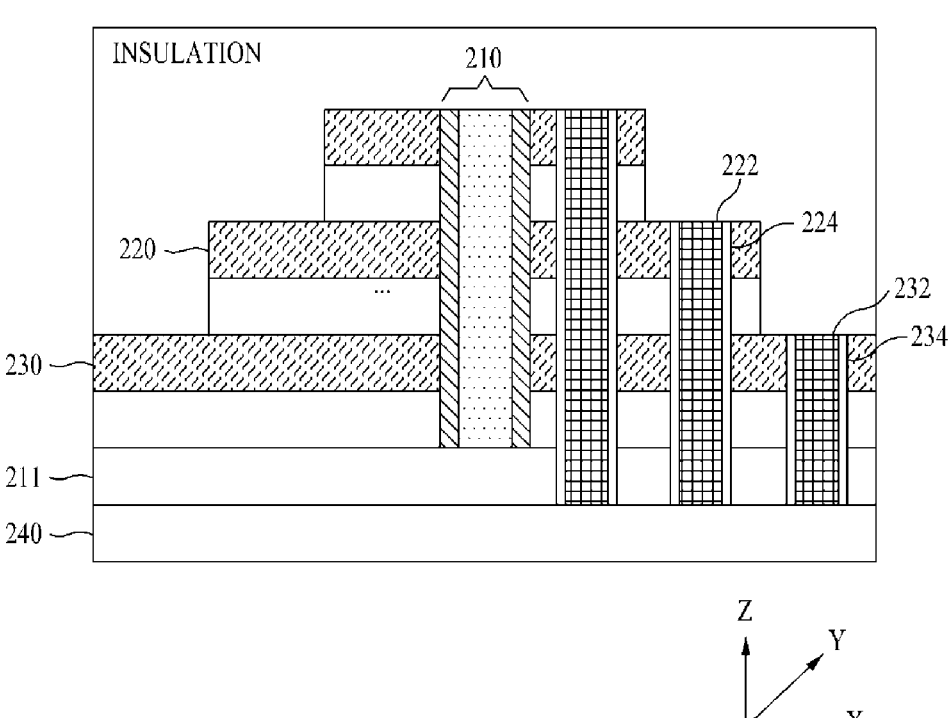
Figure 9D:
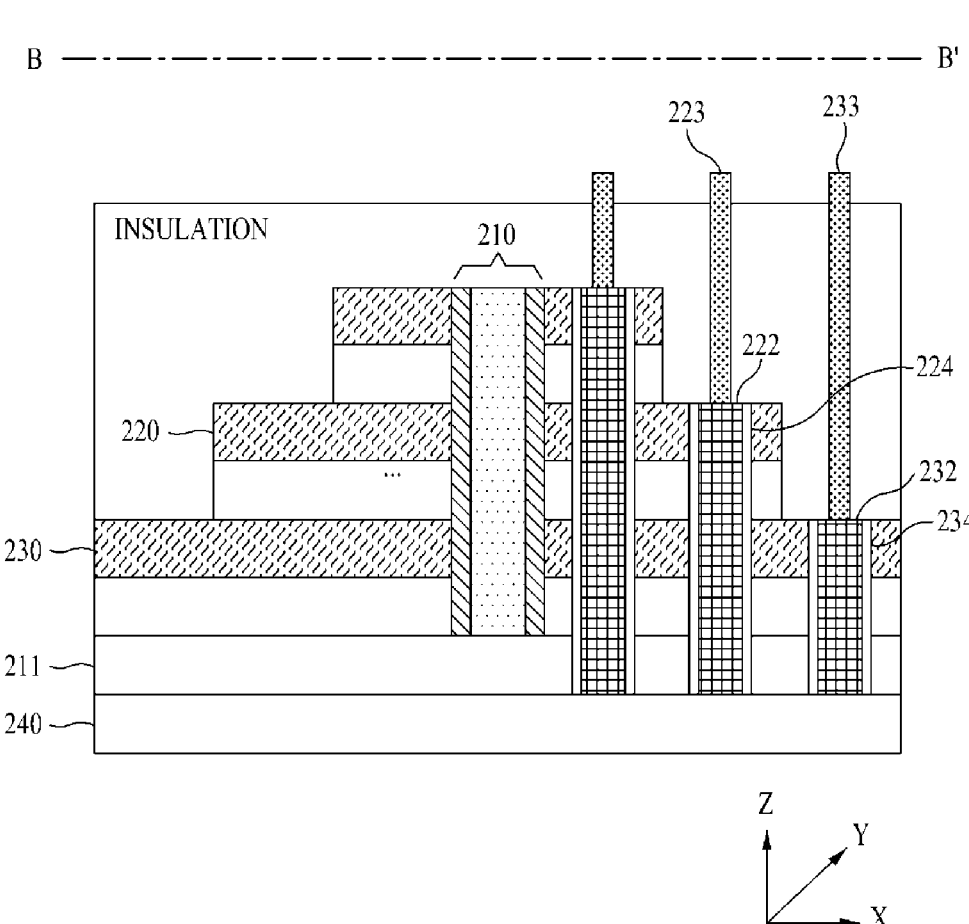

Next, in operation S630, the manufacturing system forms via holes 270 and 280 for the plurality of word lines 220 and 230 in the semiconductor structure as shown in FIGS. 7C, 9B and 10C, where the via holes 270 and 280 extend in one direction and penetrate the plurality of word lines 220 and 230 on the plane of the plurality of word lines 220 and 230 to expose the row decoder 240.

Then, in operation S640, the manufacturing system forms the contacts 221 and 231 and plug vias 222 and 232 of the plurality of word lines 220 and 230, which extend with a conductive material in the contact holes 250 and 260 and the via holes 270 and 280. In addition, the manufacturing system connects the contacts 221 and 231 and the plug vias 222 and 232 of the plurality of word lines 220 and 230 to each other to connect the plurality of word lines 220 and 230 to the row decoder 240.

In more detail, in operation S640, the manufacturing system forms the contacts 221 and 231 of the plurality of word lines 220 and 230 of a conductive material in the contact holes 250 and 260 for the plurality of word lines 220 and 230 as shown in FIGS. 7D, 8C, 9C and 10D. The plug vias 222 and 232 of the plurality of word lines 220 and 230 are formed in the via holes 270 and 280 for the plurality of word lines 220 and 230 that pass through the plurality of word lines 220 and 230 on the plane of the plurality of word lines 220 and 230 to contact the row decoder 240. Then, as shown in FIGS. 7E, 8D, 9D and 10E, the contacts 221 and 231 and the plug vias 222 and 232 of the plurality of word lines 220 and 230 are connected to each other by the plurality of connection wires 223 and 233, such that the plurality of word lines 220 and 230 are connected to the row decoder 240, respectively.

In the process of extending and forming the plug vias 222 and 232 of the plurality of word lines 220 and 230 to contact the row decoder 240, the manufacturing system may extend the plug vias 222 and 232 of the plurality of word lines 220 and 230 such that the structure is provided in which the plug vias 222 and 232 of the plurality of word lines 220 and 230 are isolated from the plurality of word lines 220 and 230 on a plane within the via holes 270 and 280 for the plurality of word lines 220 and 230.

For example, the manufacturing system forms oxide films 224 and 234 including inner holes in via holes 270 and 280 for the plurality of word lines 220 and 230, and then, forms the plug vias 222 and 232 of the plurality of word lines 220 and 230 of a conductive material in the inner holes of the oxide films 224 and 234 of the plurality of word lines 220 and 230 such that the plug vias 222 and 232 are isolated from the plurality of word lines 220 and 230 by the oxide films 224 and 234, respectively.

In this case, operation S640, the manufacturing system connects the plug vias 222 and 232 of the plurality of word lines 220 and 230 to the contacts 221 and 231 of the plurality of word lines 220 and 230, respectively, such that the plurality of connection wires 223 and 233, through which the plug vias 222 and 232 of the plurality of word lines 220 and 230 are connected to the contacts 221 and 231 of the plurality of word lines 220 and 230, are arranged in the plane of the plurality of word lines 220 and 230. Thus, the connection path from the plurality of word lines 220 and 230 to the row decoder 240 has a short distance while being prevented from deviating from the plane of the plurality of word lines 220 and 230.

In addition, after determining the locations on the plane of the plurality of word lines 220 and 230 where the contact holes 250 and 260 for the plurality of word lines 220 and 230 and the via holes 270 and 280 for the plurality of word lines 220 and 230 to allow the length of each of the plurality of connection wires 223 and 233 to be minimized, in operations S620 and S630, the manufacturing system forms the contact holes 250 and 260 for the plurality of word lines 220 and 230 and the via holes 270 and 280 for the plurality of word lines 220 and 230 according to the determined locations, such that the connection path from the plurality of word lines 220 and 230 to the row decoder 240 may have the shortest distance.

Figure 11:
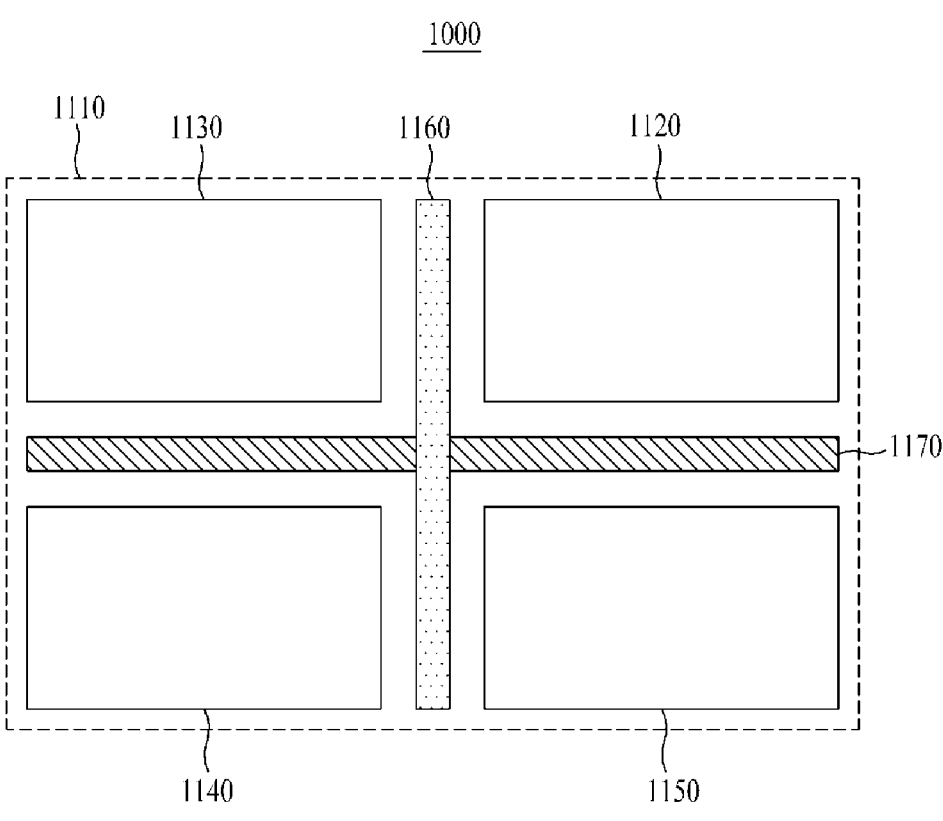
FIG. 11 is an X-Y plan view illustrating a 3D flash memory according to an embodiment.

FIG. 11 is an X-Y plan view illustrating a 3D flash memory according to an embodiment.

Referring to FIG. 11, a 3D flash memory 1100 according to an embodiment includes at least one cell block 1110, a plurality of peripheral circuit blocks 1120 to 1150, a row decoder 1160, and a column decoder 1170.

The at least one cell block 1110 may include a plurality of memory cell strings (not shown) extending in one direction (e.g., a vertical direction) on a substrate. Accordingly, the at least one cell block 1110 may further include transistors of the plurality of memory cell strings formed in the substrate.

In this case, each of the plurality of memory cell strings may include a channel layer (not shown) extending in one direction, a charge storage layer (not shown) extending in one direction to surround the channel layer, and a plurality of word lines (not shown) vertically connected to the channel layer and the charge storage layer. The channel layer may be formed of single crystal silicon or poly-silicon, and may be formed by a selective epitaxial growth process or a phase transition epitaxial process using a substrate (not shown) as a seed. In addition, the channel layer may be formed in a hollow tube shape and further include a filling film (not shown) therein. The charge storage layer is a component having a memory function for storing charge from current introduced through a plurality of word lines, and may be formed in, for example, an oxide-nitride-oxide (ONO) structure. The plurality of word lines may be formed of a conductive material (e.g., W, Ti, Ta, Cu, Au, or the like) for supplying current, and a plurality of insulation layers (not shown) formed of an insulating material (e.g., $Al_2O_3$, $HfO_2$, $TiO_2$, $La_2O_5$, $BaZrO_3$, $Ta_2O_5$, $ZrO_2$, $Gd_2O_3$, $Y_2O_3$, or the like) may be interposed between the plurality of word lines.

In this case, because a cell-on-peripheral (COP) structure is applied to the substrate of the at least one cell block 1110, the plurality of peripheral circuit blocks 1120 to 1150 each including at least one peripheral circuit may be located under the at least one cell block 1110. Accordingly, each of the plurality of peripheral circuit blocks 1120 to 1150 may further include a transistor of at least one peripheral circuit.

The row decoder 1160 and the column decoder 1170 are located under the at least one cell block 1110 and are decoders for the at least one cell block 1110 and the plurality of peripheral circuit blocks 1120 to 1150, where the row decoder 1160 may perform a function of selecting a row of the plurality of memory cell strings included in the at least one cell block 1110, and the column decoder 1160 may perform a function of selecting a column of the plurality of memory cell strings.

Specifically, the row decoder 1160 and the column decoder 1170 are arranged while dividing the plurality of peripheral circuit blocks 1120 to 1150 such that the plurality of peripheral circuit blocks 1120 to 1150 are symmetrical to each other in the plane of the 3D flash memory 1100.

In more detail, the row decoder 1160 and the column decoder 1170 are arranged in a cross shape in the plane of the 3D flash memory 1100, such that the plurality of peripheral circuit blocks 1120 to 1150 are symmetrically divided into quadrants formed by the cross shape.

For example, in the plane of the 3D flash memory 1100, the row decoder 1160 is positioned in the vertical direction and the column decoder 1170 is positioned in the horizontal direction while crossing the midpoint of the row decoder 1160, so that the row decoder 1160 and the column decoder 1170 may be arranged in a cross shape. Accordingly, the row decoder 1160 and the column decoder 1170 may symmetrically divide the plurality of peripheral circuit blocks 1120 to 1150 into quadrants by the cross shape.

As a more specific example, the plurality of peripheral circuit blocks 1120 to 1150 may be disposed one by one in quadrants formed by a cross formed by the row decoder 1160 and the column decoder 1170 to be symmetrical to each other (for example, the first peripheral circuit block 1120 is disposed in the first quadrant, the second peripheral circuit block 1130 is disposed in the second quadrant, and the third peripheral circuit block 1140 is disposed in the third quadrant, and the fourth peripheral circuit block 1150 is disposed in the fourth quadrant, so that the first peripheral circuit block 1120, the second peripheral circuit block 1130, the third peripheral circuit block 1140, and the fourth peripheral circuit block 1150 are symmetrical to each other and located while being divided).

Although the row decoder 1160 and the column decoder 1170 have been described as being arranged in a cross shape, the embodiment is not limited thereto and the row decoder 1160 and the column decoder 1170 may be arranged in various shapes to symmetrically divide the plurality of peripheral circuit blocks 1120 to 1150. Other shapes formed by the row decoder 1160 and the column decoder 1170 will be described with reference to FIG. 13 below.

As described above, because the plurality of peripheral circuit blocks 1120 to 1150 are positioned to be divided symmetrically to each other, transistors of at least one peripheral circuit included in each of the plurality of peripheral circuit blocks 1120 to 1150 may be positioned to be symmetrical to each other by the row decoder 1160 and the column decoder 1170 in the plane of the 3D flash memory 1100. Accordingly, a wire connecting transistors of at least one peripheral circuit included in each of the plurality of peripheral circuit blocks 1120 to 1150 to the row decoder 1160 and the column decoder 1170 may have a minimized length according to the optimized layout.

In addition, although not shown in the drawing, when the plurality of at least one cell block 1110 is provided, the row decoder 1160 and the column decoder 1170 may be arranged to divide the plurality of cell blocks symmetrically to each other. In this case, in the same manner that the plurality of cell blocks are divided by the row decoder 1160 and the column decoder 1170, the plurality of peripheral circuit blocks 1120 to 1150 may be divided by the row decoder 1160 and the column decoder 1170. However, the plurality of peripheral circuit blocks 1120 to 1150 are located on the same plane (below the plurality of cell blocks) as the row decoder 1160 and the column decoder 1170, while the plurality of cell blocks are different from the row decoder 1160 and the column decoder 1170 in that they are located on a different plane (the plurality of cell blocks are located above the row decoder 1160 and the column decoder 1170).

When the plurality of cell blocks are divided by the row decoder 1160 and the column decoder 1170, transistors of each of the plurality of memory cell strings included in each of the plurality of cell blocks may be located to be symmetrical to each other by the row decoder 1160 and the column decoder 1170 in the plane of the 3D flash memory 1100. Accordingly, wires connecting transistors of each of the plurality of memory cell strings included in each of the plurality of cell blocks to the row decoder 1160 and the column decoder 1170 may have a minimized length according to the optimized layout.

Hereinafter, a method of manufacturing the 3D flash memory 1100 described above will be described in detail with reference to FIG. 12.

FIG. 12 is a flowchart illustrating a method of manufacturing a 3D flash memory according to an exemplary embodiment. An automated and mechanized manufacturing system may be used as a subject performing the method of manufacturing a 3D flash memory. The 3D flash memory manufactured through operation S1210 to S1220 to be described later may have the structure described above with reference to FIG. 11.

Referring to FIG. 12, in operation S1210, the manufacturing system may arrange a row decoder and a column decoder in a cross shape in a plane of the 3D flash memory to divide regions in which a plurality of peripheral circuit blocks are to be formed symmetrically in quadrants by the cross shape. For example, the manufacturing system may generate the row decoder positioned vertically in the plane of the 3D flash memory and the column decoder positioned horizontally across an intermediate point of the row decoder.

Accordingly, in operation S1220, the manufacturing system may divide the plurality of peripheral circuit blocks into regions so as to be symmetrical to each other by the row decoder and the column decoder.

Thereafter, in operation S1230, the manufacturing system may form at least one cell block including the plurality of memory cell strings extending in one direction over the plurality of peripheral circuit blocks.

As described above, it has been described in operation S1210 that the manufacturing system arranges the row decoder and column decoder in a cross shape, but the embodiment is not limited thereto. The manufacturing system may generate the row decoders and column decoder in various shapes on the premise that regions in which plurality of peripheral circuit blocks are to be formed are divided to be symmetrical to each other within the plane of the 3D flash memory.

Figure 13:
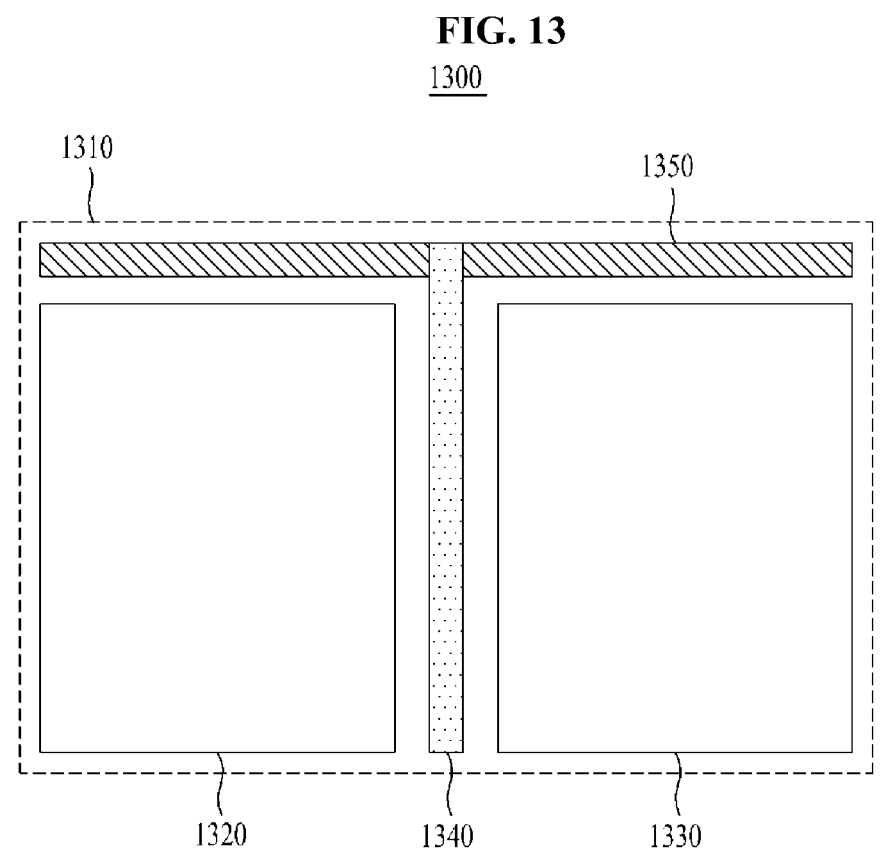

FIG. 13 is an X-Y plan view illustrating a 3D flash memory according to another embodiment.

Referring to FIG. 13, a 3D flash memory 1300 according to an embodiment includes at least one cell block 1310, a plurality of peripheral circuit blocks 1320 and 1330, a row decoder 1340, and a column decoder 1350.

The at least one cell block 1310 may include a plurality of memory cell strings (not shown) extending in one direction (e.g., a vertical direction) on a substrate. Accordingly, the at least one cell block 1310 may further include transistors of the plurality of memory cell strings formed in the substrate.

In this case, each of the plurality of memory cell strings may include a channel layer (not shown) extending in one direction, a charge storage layer (not shown) extending in one direction to surround the channel layer, and a plurality of word lines (not shown) vertically connected to the channel layer and the charge storage layer. The channel layer may be formed of single crystal silicon or poly-silicon, and may be formed by a selective epitaxial growth process or a phase transition epitaxial process using a substrate (not shown) as a seed. In addition, the channel layer may be formed in a hollow tube shape and further include a filling film (not shown) therein. The charge storage layer is a component having a memory function for storing charge from current introduced through a plurality of word lines, and may be formed in, for example, an oxide-nitride-oxide (ONO) structure. The plurality of word lines may be formed of a conductive material (e.g., W, Ti, Ta, Cu, Au, or the like) for supplying current, and a plurality of insulation layers (not shown) formed of an insulating material (e.g., $Al_2O_3$, $HfO_2$, $TiO_2$, $La_2O_5$, $BaZrO_3$, $Ta_2O_5$, $ZrO_2$, $Gd_2O_3$, $Y_2O_3$, or the like) may be interposed between the plurality of word lines.

In this case, because a cell-on-peripheral (COP) structure is applied to the substrate of the at least one cell block 1310, the plurality of peripheral circuit blocks 1320 and 1330 each including at least one peripheral circuit may be located under the at least one cell block 1110. Accordingly, each of the plurality of peripheral circuit blocks 1320 and 1330 may further include a transistor of at least one peripheral circuit.

The row decoder 1340 and the column decoder 1350 are located under the at least one cell block 1310 and are decoders for the at least one cell block 1310 and the plurality of peripheral circuit blocks 1320 and 1330, where the row decoder 1340 may perform a function of selecting a row of the plurality of memory cell strings included in the at least one cell block 1310, and the column decoder 1350 may perform a function of selecting a column of the plurality of memory cell strings included in the at least one cell block 1310.

Specifically, the row decoder 1340 and the column decoder 1350 are arranged while dividing the plurality of peripheral circuit blocks 1320 and 1330 such that the plurality of peripheral circuit blocks 1320 and 1330 are symmetrical to each other in the plane of the 3D flash memory 1300.

In more detail, the row decoder 1340 and the column decoder 1350 may be arranged in a T-shape in the plane of the 3D flash memory 1300, such that the plurality of peripheral circuit blocks 1320 and 1330 are symmetrically divided into two quadrants by the T shape.

For example, in the plane of the 3D flash memory 1300, the column decoder 1350 is positioned in the horizontal direction and the row decoder 1340 is positioned in the vertical direction from the midpoint of the column decoder 1350 to one point, so that the row decoder 1340 and the column decoder 1350 may be arranged in a T-shape. Accordingly, the row decoder 1340 and the column decoder 1350 may symmetrically divide the plurality of peripheral circuit blocks 1320 and 1330 into two quadrants by the T-shape.

The plurality of peripheral circuit blocks 1320 and 1330 may be symmetrical to each other by being disposed one by one on each of the two quadrants by the T-shape formed by the row decoder 1340 and the column decoder 1350 (for example, the first peripheral circuit block 1320 is disposed in the left quadrant by the T shape, and the second peripheral circuit block 1330 is disposed in the right quadrant by the T shape, so that the first peripheral circuit block 1320 and the second peripheral circuit block 1330 may be located while being divided symmetrically to each other).

Although the row decoder 1340 and the column decoder 1350 have been described as being arranged in the T-shape, the embodiment is not limited thereto and the row decoder 1340 and the column decoder 1350 may be arranged in various shapes to symmetrically divide the plurality of peripheral circuit blocks 1320 and 1330.

As described above, because the plurality of peripheral circuit blocks 1320 and 1330 are positioned to be divided symmetrically to each other, transistors of at least one peripheral circuit included in each of the plurality of peripheral circuit blocks 1320 and 1330 may be positioned to be symmetrical to each other by the row decoder 1340 and the column decoder 1350 in the plane of the 3D flash memory 1300. Accordingly, a wire connecting transistors of at least one peripheral circuit included in each of the plurality of peripheral circuit blocks 1320 and 1330 to the row decoder 1340 and the column decoder 1350 may have a minimized length according to the optimized layout.

In addition, although not shown in the figure, when the plurality of at least one cell block 1310 is provided, the row decoder 1340 and the column decoder 1350 may be arranged to divide the plurality of cell blocks symmetrically to each other. In this case, in the same manner that the plurality of cell blocks are divided by the row decoder 1340 and the column decoder 1350, the plurality of peripheral circuit blocks 1320 and 1330 may be divided by the row decoder 1340 and the column decoder 1350. However, the plurality of peripheral circuit blocks 1320 and 1330 are located on the same plane (below the plurality of cell blocks) as the row decoder 1340 and the column decoder 1350, while the plurality of cell blocks are different from the row decoder 1340 and the column decoder 1350 in that they are located on a different plane (the plurality of cell blocks are located above the row decoder 1340 and the column decoder 1350).

When the plurality of cell blocks are divided by the row decoder 1340 and the column decoder 1350, transistors of each of the plurality of memory cell strings included in each of the plurality of cell blocks may be located to be symmetrical to each other by the row decoder 1340 and the column decoder 1350 in the plane of the 3D flash memory 1300. Accordingly, wires connecting transistors of each of the plurality of memory cell strings included in each of the plurality of cell blocks to the row decoder 1340 and the column decoder 1350 may have a minimized length according to the optimized layout.

Hereinafter, a method of manufacturing the 3D flash memory 1300 described above will be described in detail with reference to FIG. 14.

FIG. 14 is a flowchart illustrating a method of manufacturing a 3D flash memory according to an embodiment. An automated and mechanized manufacturing system may be used as a subject performing the method of manufacturing a 3D flash memory. The 3D flash memory manufactured through operation S1410 to S1420 to be described later may have the structure described above with reference to FIG. 13.

Referring to FIG. 14, in operation S1410, the manufacturing system may arrange a row decoder and a column decoder in a T-shape in the plane of the 3D flash memory to divide regions in which the plurality of peripheral circuit blocks are to be formed symmetrically in two quadrants by the T-shape. For example, the manufacturing system may generate the column decoder positioned in a horizontal direction in the plane of the 3D flash memory and the row decoder positioned in a vertical direction from an intermediate point of the column decoder to one point.

Accordingly, in operation S1420, the manufacturing system may divide the plurality of peripheral circuit blocks into regions so as to be symmetrical to each other by the row decoder and the column decoder.

Thereafter, in operation S1430, the manufacturing system may form at least one cell block including the plurality of memory cell strings extending in one direction over the plurality of peripheral circuit blocks.

As described above, it has been described in operation S1410 that the manufacturing system arranges the row decoder and column decoder in a T-shape, but the embodiment is not limited thereto. The manufacturing system may generate the row decoder and the column decoder in various shapes on the premise that regions in which the plurality of peripheral circuit blocks are to be formed are divided to be symmetrical to each other within the plane of the 3D flash memory.

Figure 16A:
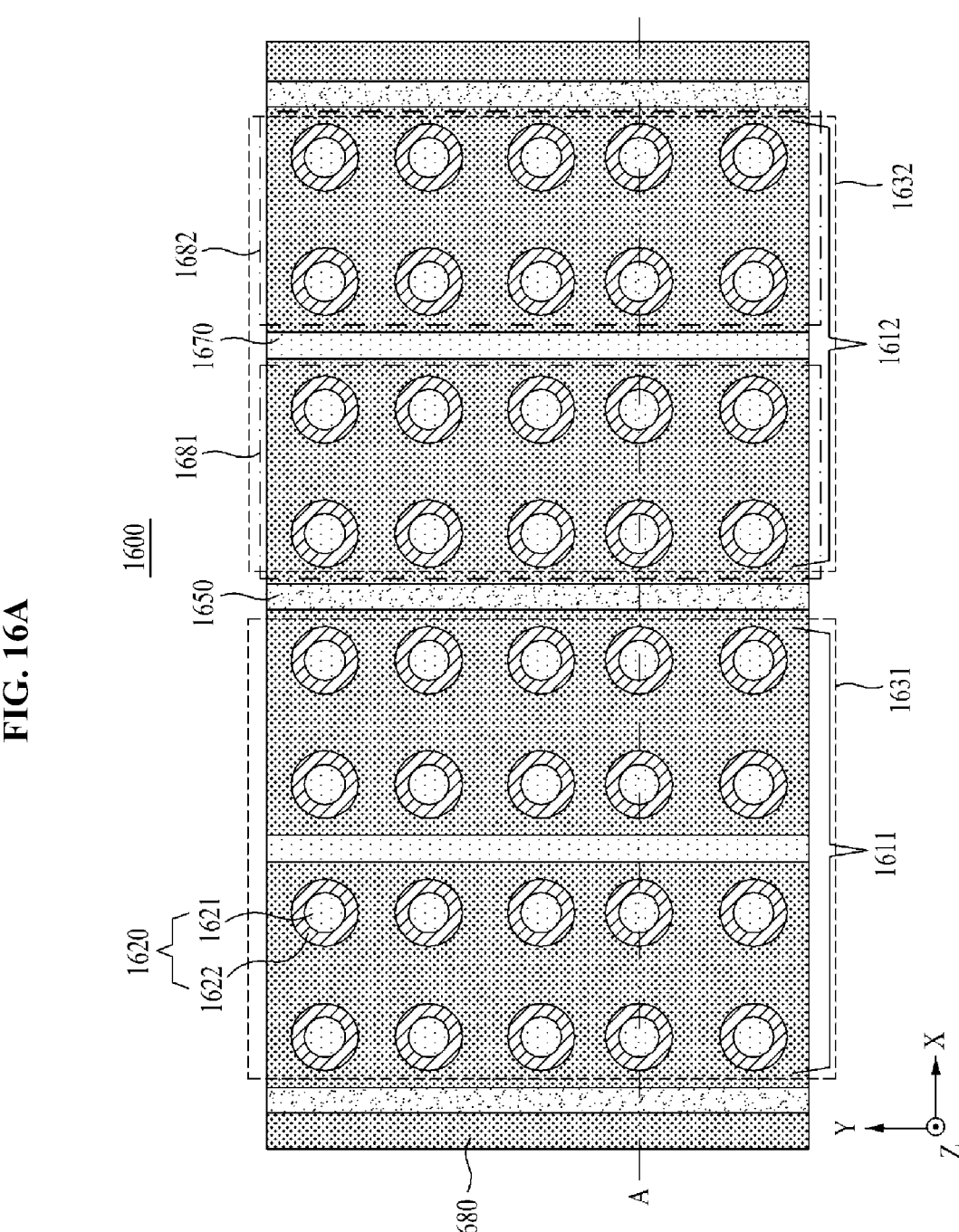
FIG. 16A is an X-Y plan view illustrating a 3D flash memory according to an embodiment.
Figure 16B:
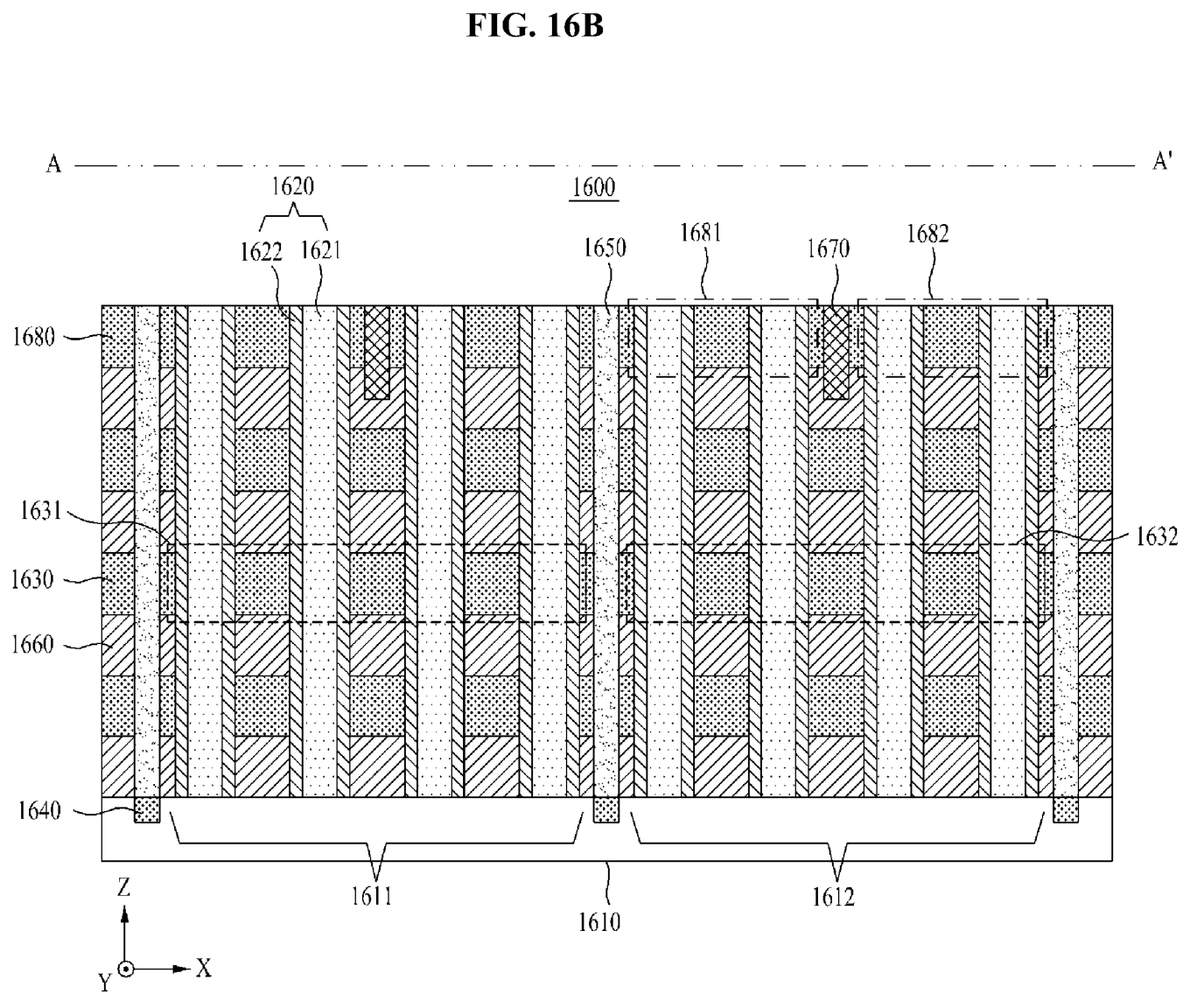

FIG. 16A is an X-Y plan view illustrating a 3D flash memory according to an embodiment. FIG. 16B is an X-Z cross-sectional view illustrating a 3D flash memory according to an embodiment.

Referring to FIGS. 16A and 16B, a 3D flash memory 1600 according to an embodiment includes a substrate 1610, a plurality of memory cell strings 1620, a plurality of word lines 1630, at least one buried source line 1640, and at least one word line separation slit 1650.

The substrate 1610 may formed of monocrystalline silicon or poly-silicon.

Each of the plurality of memory strings 1620 may include a channel layer 1621 and a charge storage layer 1622 while including a drain line (not shown) that extends in one direction (e.g., Z direction) on the substrate 1610 and being disposed thereover. The channel layer 1621 may be formed of monocrystalline silicon or poly-silicon. The charge storage layer 1622, which is a component for storing charge from current flowing through the plurality of word lines 1630 while surrounding the channel layer 1621, may be formed, for example, in a structure of oxide-nitride-oxide (ONO). Hereinafter, the charge storage layer 1622 will be described as including only a vertical element extending in one direction (e.g., Z direction) orthogonal to the substrate 1610, but is not limited thereto, and a horizontal element parallel with the substrate 211 and contacting the plurality of word lines 1630 may be further included.

As described above, because the channel layer 1621 and the charge storage layer 1622 constitute the plurality of memory cells corresponding to the plurality of word lines 1630, they may be referred to as a memory cell string.

The plurality of word lines 220 and 230 may be formed of a conductive material such as tungsten (W), titanium (Ti), tantalum (Ta), copper (Cu), or gold (Au) to perform functions of word lines while being connected in a direction perpendicular to the plurality of memory cell strings 1620. Similarly, the plurality of insulating layers 1660, which are connected to the plurality of memory cell strings 1620 in a vertical direction and formed of various materials having insulating properties, and the plurality of word lines 1630 may be alternately interposed between the plurality of word lines 1630.

The at least one buried source line 1640 may be used as a source electrode for the plurality of memory cell strings 1620 while being buried in the substrate 1610, and may be formed of a conductive material distinct from the substrate 1610. In this case, the at least one buried source line 1640 may be formed while being buried in a region of the substrate 1610 excluding a region where the plurality of memory cell strings 1620 are formed.

For example, at least one buried source line 1610 is not formed to serve as a source electrode by doping impurities in a partial region of the substrate 1610, but may be formed by burying and extending a conductive material (e.g., tungsten (W), titanium (Ti), tantalum (Ta), copper (Cu), gold (Au), or the like) into the substrate 1610 in one direction (e.g., Y direction) to be distinguished from monocrystalline silicon or polysilicon, which is a material constituting the substrate 1610.

Figure 15A:
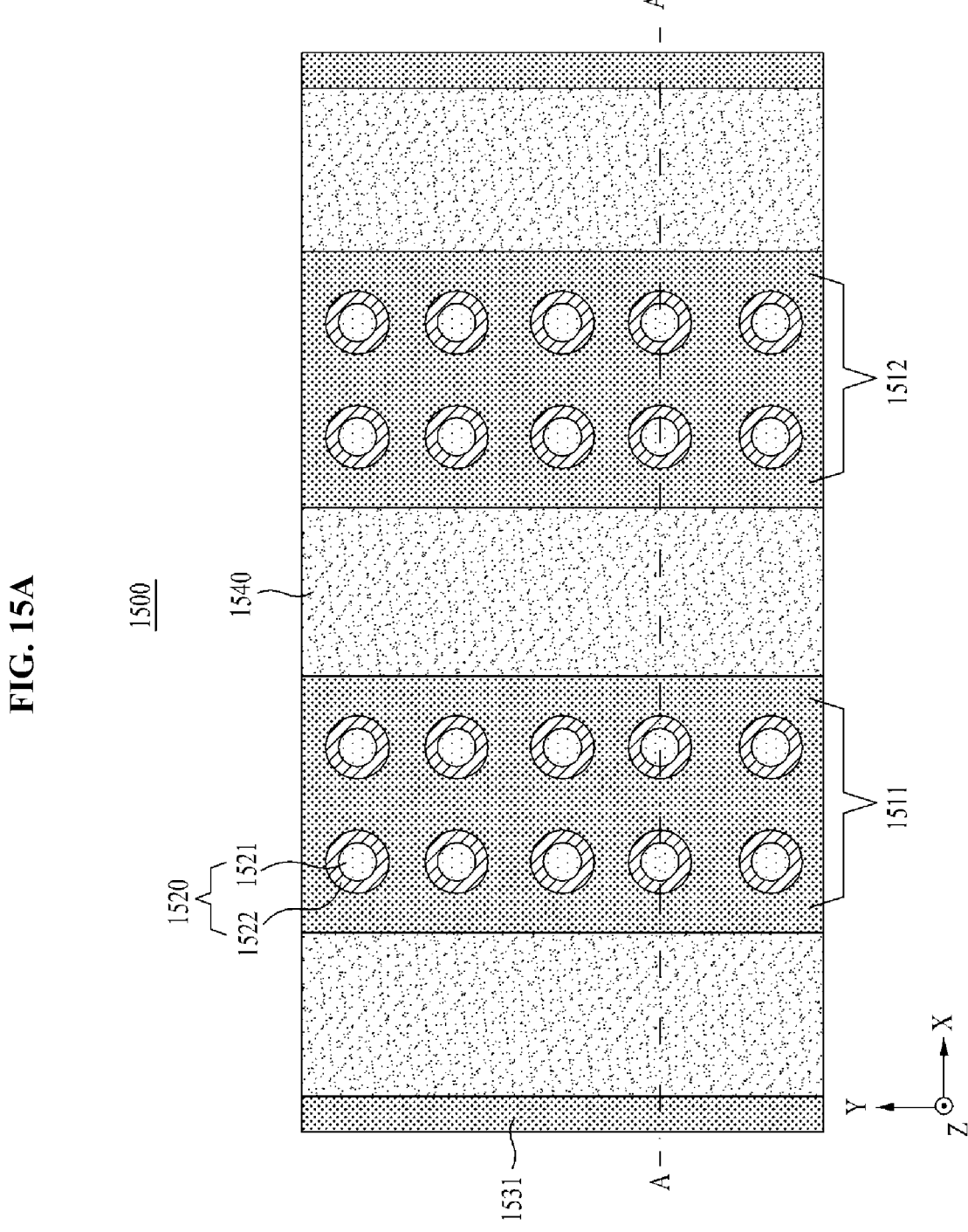
FIG. 15A is an X-Y plan view illustrating a conventional 3D flash memory.
Figure 15B:
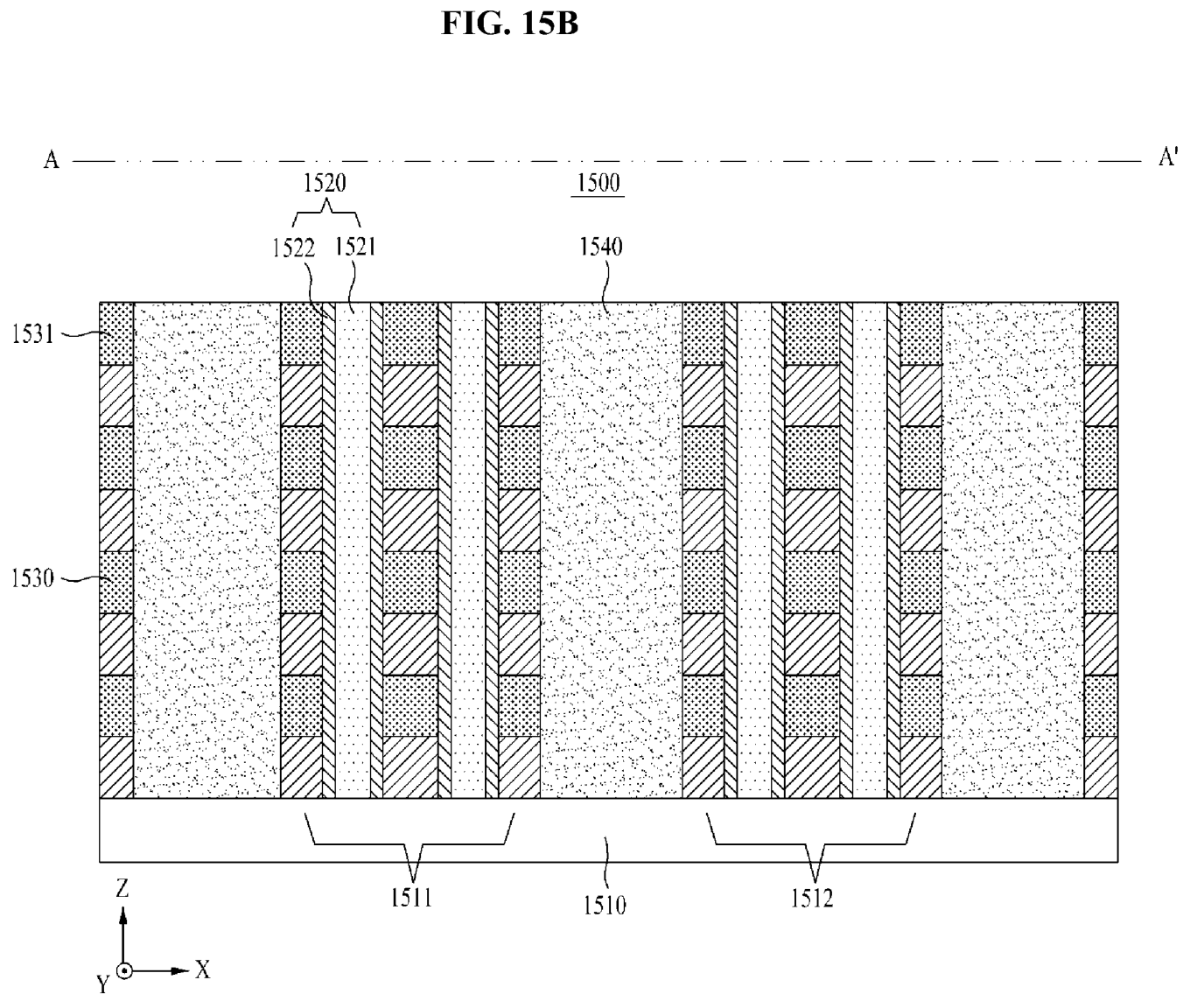

As described above, because the at least one buried source line 1640 is formed buried in the substrate 1610 without a step difference having a height above the substrate 1610, the complexity of the manufacturing process may be remarkably reduced compared to a stepped common source line having a height above the substrate described with reference to FIGS. 15A and 15B.

In addition, the at least one buried source line 1640 may have a minimized width while satisfying a condition for being used as a common source electrode by the plurality of memory cell strings 1620. For example, the at least one buried source line 1640 may have the smallest width on the premise that conditions related to current and voltage characteristics that can be used as a common source electrode by the plurality of memory cell strings 1620 are satisfied.

Accordingly, the 3D flash memory 1600 according to an embodiment may include the at least one buried source line 1640 having a width significantly narrower than the width of a conventional common source line, so that it is possible to improve the cell integration of the plurality of memory cell strings 1620.

In addition, the at least one buried source line 1640 may pass through the substrate 1610 to be connected to the plurality of memory cell strings 1620. For example, the at least one buried source line 1640 may be connected to the plurality of memory cell strings 1620 through the wire (not shown) buried in the substrate 1610.

Accordingly, the 3D flash memory 1600 according to an embodiment may simplify wire layout design compared to a conventional 3D flash memory in which a common source line is connected to a memory cell string through an external wire disposed above the memory cell string.

In this case, the at least one word line separation slit 1650 to be described later may be located above the at least one buried source line 1640, but the embodiment is not limited thereto and the one word line separation slit 1650 may be located on the substrate 1610 regardless of the location of the at least one buried source line 1640.

The at least one word line separation slit 1650 is a component for separating the plurality of word lines 1630. Specifically, the at least one word line separation slit 1650 may extend in a direction perpendicular to the plurality of word lines 1630 such that parts 1631 and 1632 separated from the plurality of word lines 1630 are spaced apart from each other by the plurality of memory blocks 1611 and 1612, thereby separating the plurality of word lines 1630. In this case, the plurality of memory blocks 1611 and 1612 may be formed by grouping the plurality of memory cell strings 1620 in an arbitrary number.

In this case, the depth, at which the at least one word line separation slit 1650 extends in a direction perpendicular to the plurality of word lines 1630, may be as much as the depth of a region corresponding to the plurality of word lines 1630. That is, the at least one word line separation slit 1650 separates and cuts the plurality of word lines 1630 while extending in the vertical direction as much as the depth of the region corresponding to the plurality of word lines 1630, so that it is possible to prevent the parts 1631 and 1632 separated from the plurality of word lines 1630 from being connected to each other.

Hereinafter, the separation of the plurality of word lines 1630 by the at least one word line separation slit 1650 means that the parts 1631 and 1632 separated from the plurality of word lines 1630 are electrically separated from each other while corresponding to the plurality of memory blocks 1611 and 1612. Thus, the at least one word line separation slit 1650 may have a structure in which an inner space is formed in the shape of a hollow trench or hole and the inner space is filled with an insulating material.

In addition, the at least one word line separation slit 1650 may be used as a passage through which a conductive material forming the plurality of word lines 1630 is inserted. In more detail, after the at least one word line separation slit 1650 is used as a passage through which a conductive material inserted in an operation of forming the plurality of word lines 1630 by maintaining the shape of a hollow trench or hole until the formation of the plurality of word lines 1630 is completed, the at least one word line separation slit 1650 may have a structure in which an insulating film fills an internal space after the plurality of word lines 1630 are formed.

In addition, the at least one word line separation slit 1650 may have a minimized width while satisfying a condition capable of separating the plurality of word lines 1630.

In this case, when the plurality of word lines 1630 and the at least one buried source line 1640 are simultaneously formed in a single process, the at least one word line separation slit 1650 may be located above the at least one buried source line 1640 in order to use the at least one word line separation slit 1650 as a passage through which a conductive material forming the plurality of word lines 1630 and the at least one buried source line 1640 is inserted (the at least one buried source line 1640 is located in a region located below the at least one word line separation slit 1650 on the substrate 1610).

However, the embodiment is not limited to the above, and the 3D flash memory 1600 may include a separate component as a passage into which a conductive material forming the plurality of word lines 1630 is inserted. A detailed description thereof will be described with reference to FIG. 19.

In addition, the 3D flash memory 1600 may further include at least one string selection line (SSL) separation slit 1670. The at least one SSL separation slit 1670 is a component for separating at least one SSL 280 located on an upper end of the plurality of word lines 1630. Specifically, the at least one SSL 1680 may extend in a direction perpendicular to the at least one SSL 1633 such that parts 1681 and 1682 separated from the at least one SSL 1633 are spaced apart from each other in each of the plurality of memory blocks 1611 and 1612, thereby separating at least one SSL 1680.

In this case, the depth, at which the at least one SSL separation slit 1670 extends in a direction perpendicular to the at least one SSL 1680, may be as much as the depth of a region corresponding to the at least one SSL 1680. That is, the at least one SSL separation slit 1670 separates and cuts the at least one SSL 1680 while extending in the vertical direction as much as the depth of the region corresponding to the at least one SSL 1680, so that it is possible to prevent the parts 1681 and 1682 separated from the at least one SSL 1680 from being connected to each other.

Hereinafter, the separation of the at least one SSL 1680 by the at least one SSL separation slit 1670 means that the parts 1681 and 1682 separated from the at least one SSL 1680 are electrically separated from each other. Thus, at least one SSL separation slit 1670 may have a structure in which an inner space is formed in the shape of a hollow trench or hole and the inner space is filled with an insulating material.

In addition, the at least one SSL separation slit 1670 may have a minimized width while satisfying a condition capable of separating the at least one SSL 1680.

Hereinafter, a method of manufacturing the 3D flash memory 1600 including the at least one word line separation slit 1650 and the at least one SSL separation slit 1670 having such a structure will be described with reference to FIG. 17.

Figure 17:
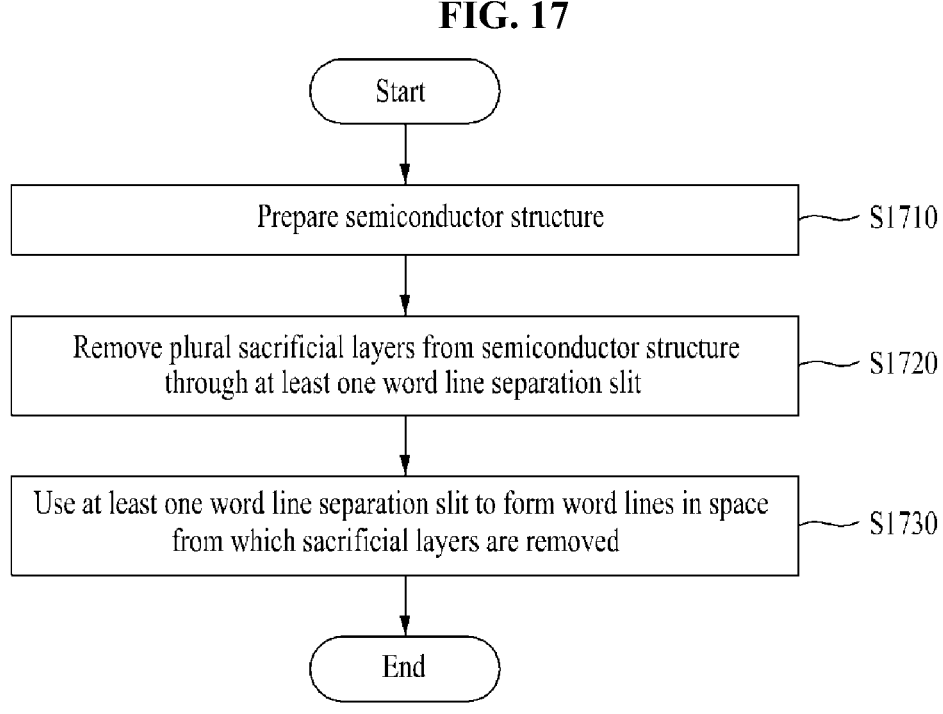
FIG. 17 is a flowchart illustrating a method of manufacturing a 3D flash memory according to an embodiment.

FIG. 17 is a flowchart illustrating a method of manufacturing a 3D flash memory according to an embodiment. FIGS. 18A to 18F are X-Z cross-sectional views illustrating a method of manufacturing a 3D flash memory according to an embodiment. Hereinafter, the manufacturing method described with reference to FIGS. 17 and 18A to 18F is for manufacturing the 3D flash memory 1600 described in FIGS. 16A and 16B, and is assumed to be performed by an automated and mechanized manufacturing system.

Figure 18A:
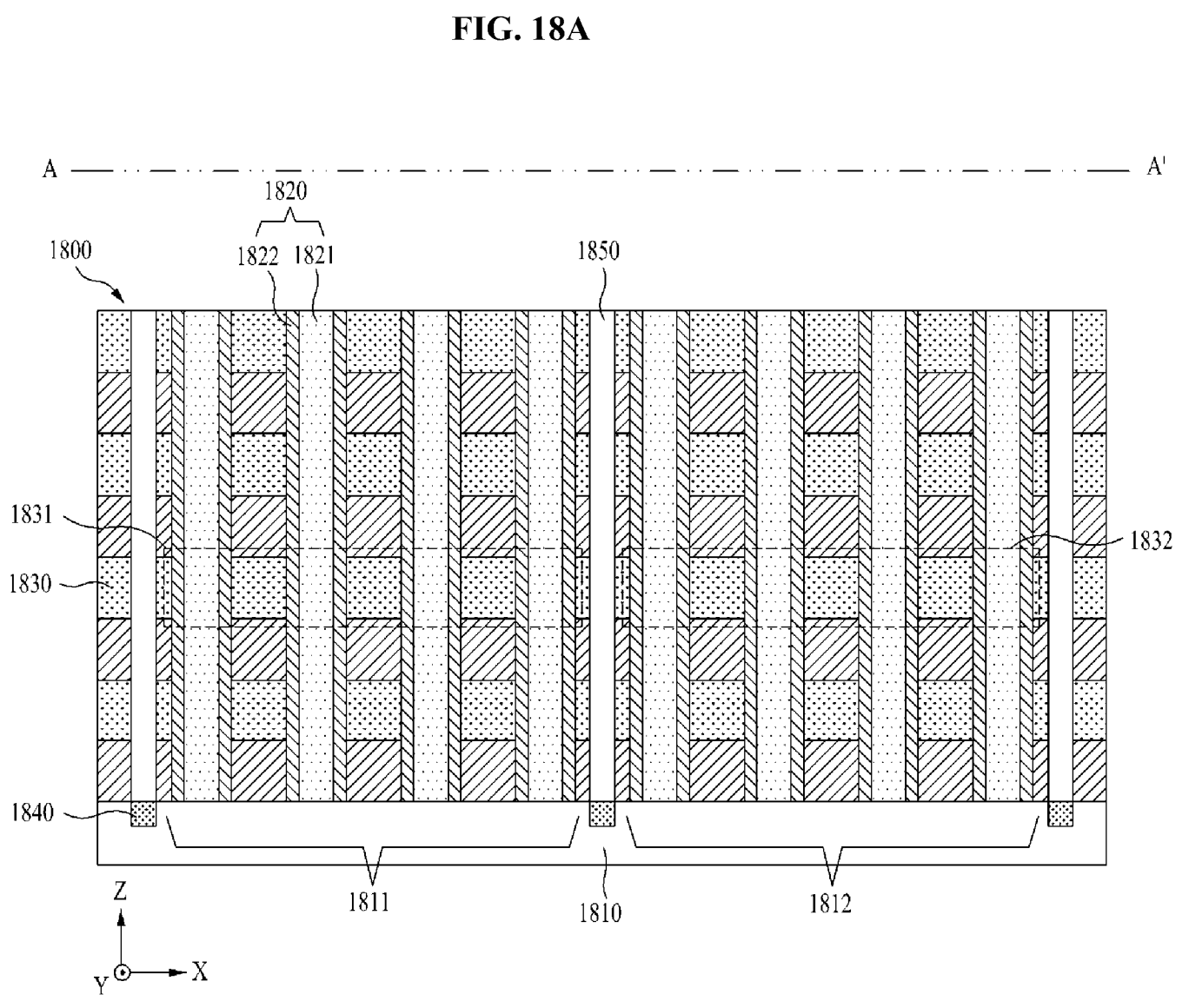
Figure 18B:
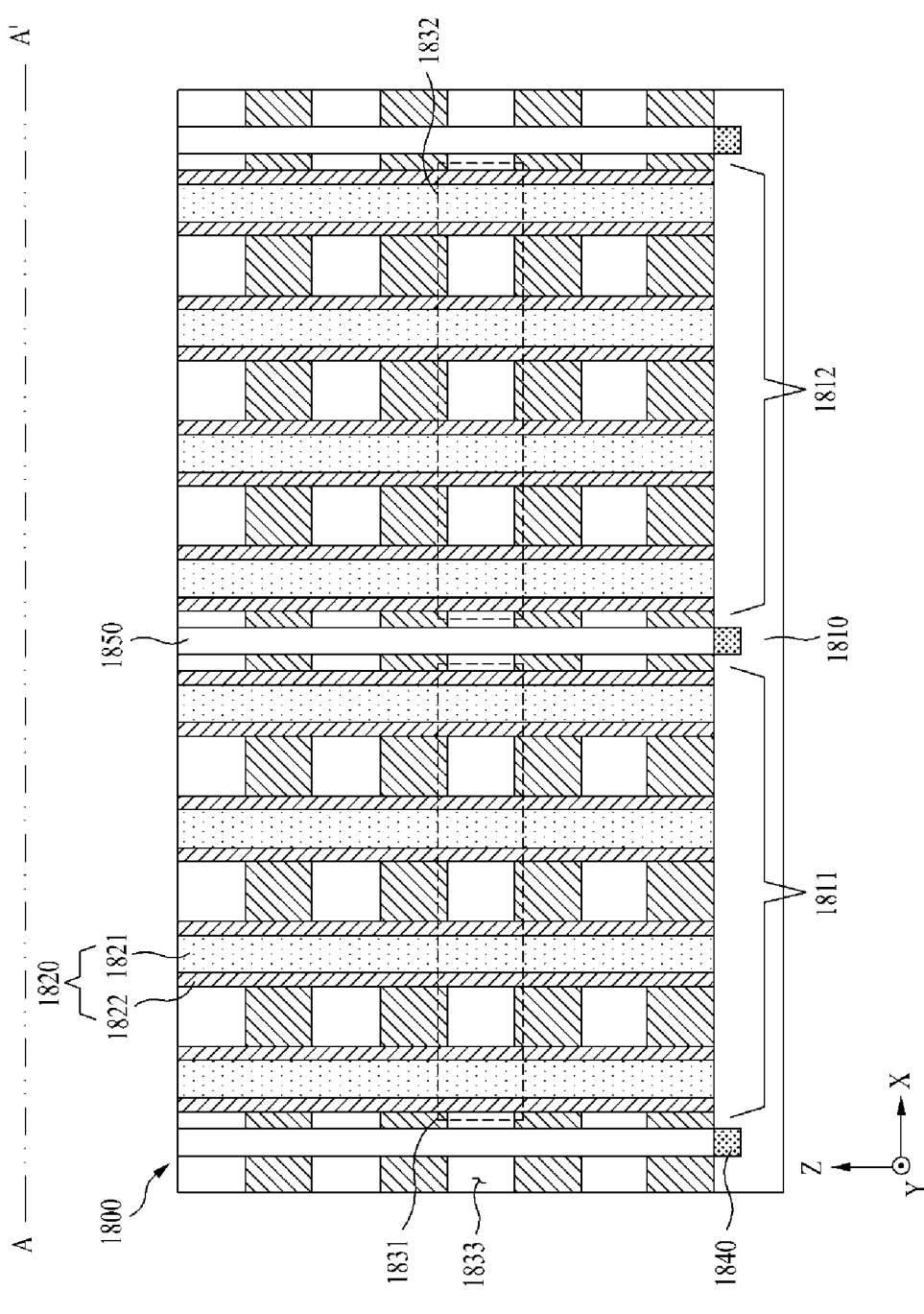

Referring to FIGS. 17 and 18A to 18F, in operation S1710, the manufacturing system prepares a semiconductor structure 1800 as shown in FIG. 18A. In this case, the semiconductor structure 1800 includes a plurality of memory cell strings 1820 each including a channel layer 1821 and a charge storage layer 1822 extending in one direction on a substrate 1810, a plurality of sacrificial layers 1830 vertically connected to the plurality of memory cell strings 1820, at least one buried source line 1840 buried in the substrate 1810, and at least one word line separation slit 1850.

In preparing such the semiconductor structure 1800, the manufacturing system may form the at least one buried source line 1840 buried in the substrate 1810 with a conductive material that is distinct from the substrate 1810, and may connect the plurality of memory cell strings 1820 and the at least one buried source line 1840 through the substrate 1810 (more precisely, through wire (not shown) buried in the substrate 1810).

In this case, in burying and forming the at least one buried source line 1840, the manufacturing system may bury the at least one buried source line 1840 in the substrate 1810 to have a minimized width while satisfying the condition that the at least one buried source line 1840 may be used as a common source electrode by the plurality of memory cell strings 1820.

In addition, in preparing the semiconductor structure 1800, the manufacturing system may extend the at least one word line separation slit 1850 in a direction perpendicular to the plurality of sacrificial layers 1830 such that parts 1831 and 1832 separated from the plurality of sacrificial layers 1830 are spaced apart from each other by the plurality of memory blocks 1811 and 1812, thereby separating the plurality of sacrificial layers 1830.

In this case, because the at least one word line separation slit 1850 included in the semiconductor structure 1800 prepared in operation S1710 should be used as a passage in steps S1720 to S1730 to be described later, the at least one word line separation slit 1850 may be formed in a shape of a hollow trench or hole.

Next, as shown in FIG. 18B, in operation S1720, the manufacturing system removes the plurality of sacrificial layers 1830 from the semiconductor structure 1800 through the at least one word line separation slit 1850.

In the drawings, it is shown that the at least one word line separation slit 1850 is already formed in the semiconductor structure 1800 in the process of preparing the semiconductor structure 1800, but the embodiment is not limited or limited thereto. After the semiconductor structure 1800 in which the at least one word line separation slit 1850 is not formed is prepared in operation S1710, the at least one word line separation slit 1850 may be formed in the semiconductor structure 1800 through a separate operation (not shown) after operation S1710.

Figure 18C:
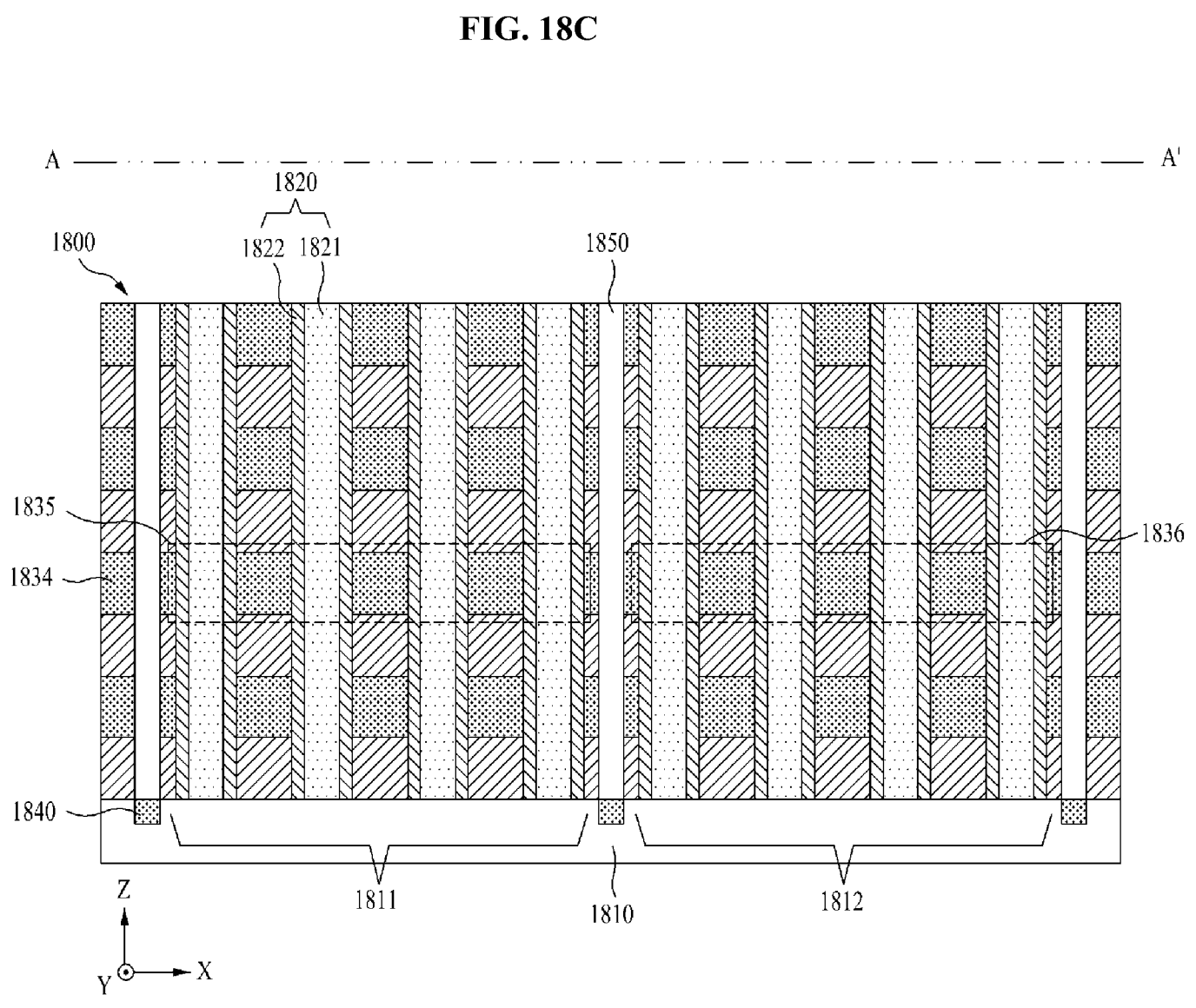

Next, in operation S1730, the manufacturing system uses the at least one word line separation slit 1850 to form the plurality of word lines in the space 1833 from which the plurality of sacrificial layers 1830 are removed. For example, as shown in FIG. 18C, the manufacturing system may insert a conductive material into the space 1833 from which the plurality of sacrificial layers 1830 are removed by using the at least one word line separation slit 1850 as a passage, thereby forming the plurality of word lines 1834.

In this case, as the at least one word line separation slit 1850 has a structure for separating the plurality of sacrificial layers 1830 in operation S1710 of preparing the semiconductor structure 1800, the plurality of word lines 1834 may be separated after operation S1730 of forming the plurality of word lines 1834 is performed. That is, the at least one word line separation slit 1850 may extend in a direction perpendicular to the plurality of word lines 1834 such that parts 1835 and 1836 separated from the plurality of word lines 1834 are spaced apart from each other by the plurality of memory blocks 1811 and 1812, thereby separating the plurality of word lines 1834.

Figure 18D:
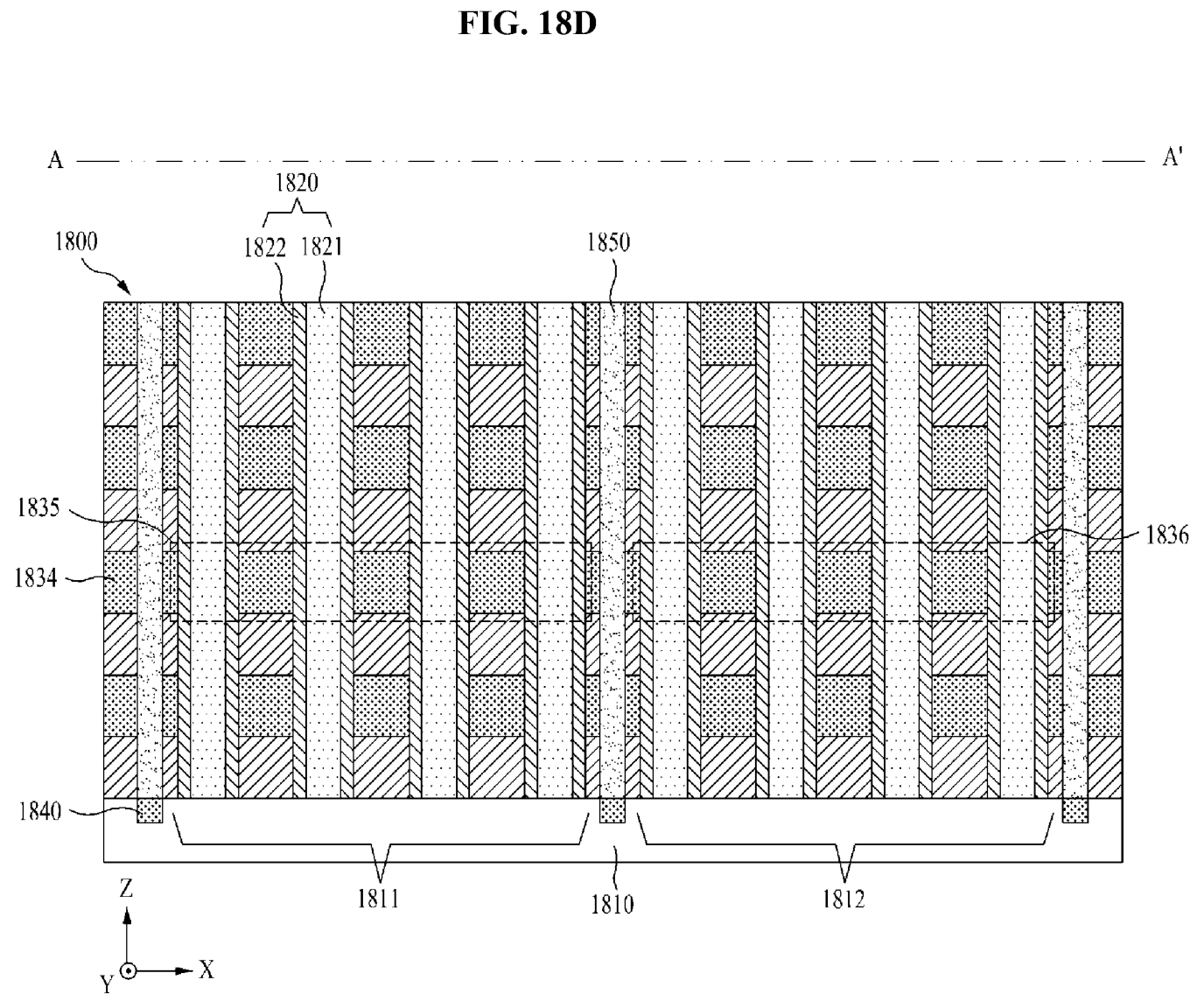

Thereafter, although not shown as a separate operation in the flowchart shown in FIG. 17, the manufacturing system may fill an insulating film in the at least one word line separation slit 1850 after the plurality of word lines 1834 are formed as shown in FIG. 18D.

In addition, although not shown as a separate operation in the flowchart shown in FIG. 17, after operation S1730, the manufacturing system may form at least one SSL separation slit 1870 separating at least one SSL 1860 located on the upper end of the plurality of word lines 1834. Specifically, the manufacturing system may extend the at least one SSL separation slit 1870 in a direction perpendicular to the at least one SSL 1860 such that parts 1861 and 1862 separated from the at least one SSL 1860 are spaced apart from each other in each of the plurality of memory blocks 1811 and 1812, thereby separating the at least one SSL 1860.

Figure 18E:
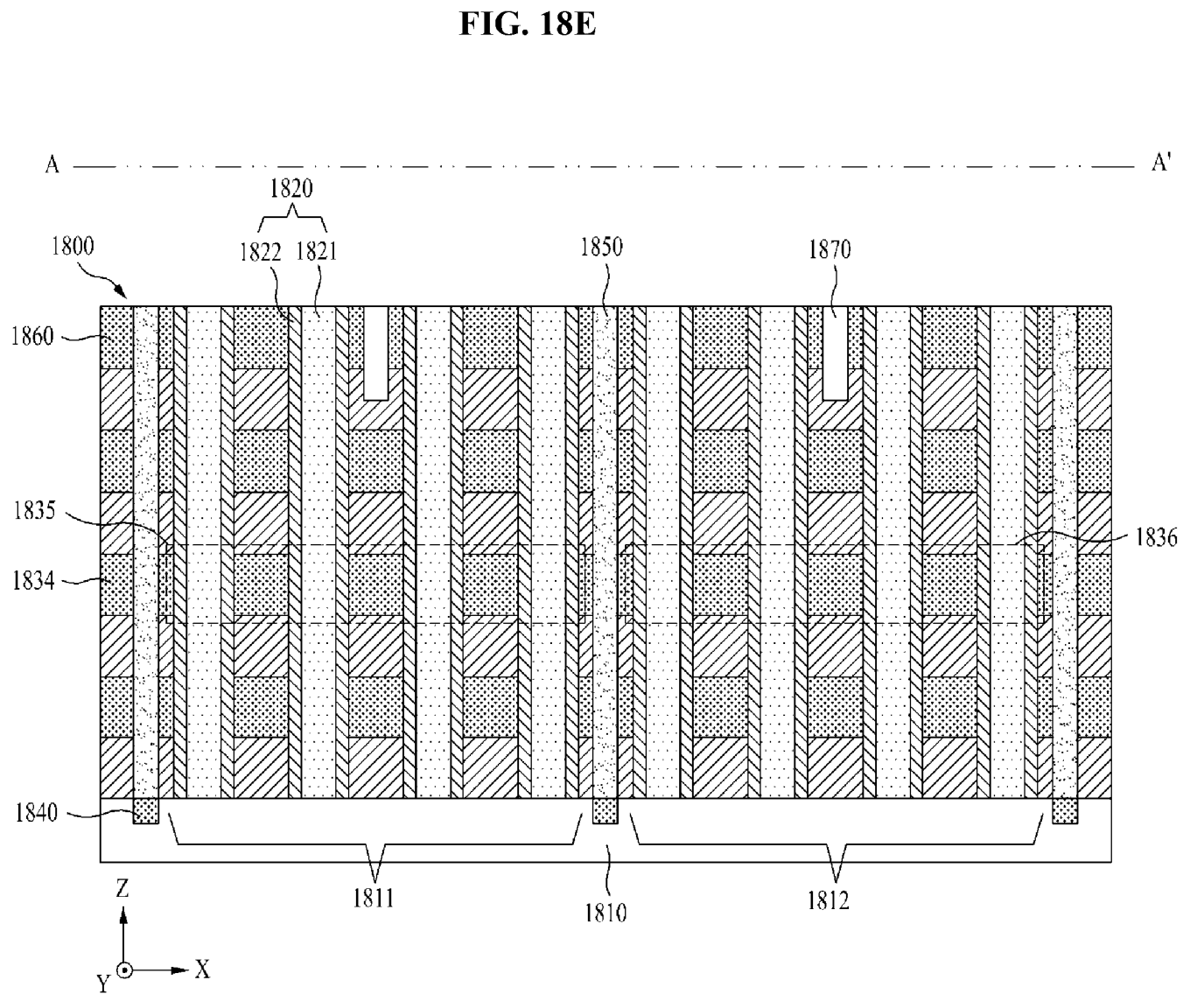
Figure 18F:
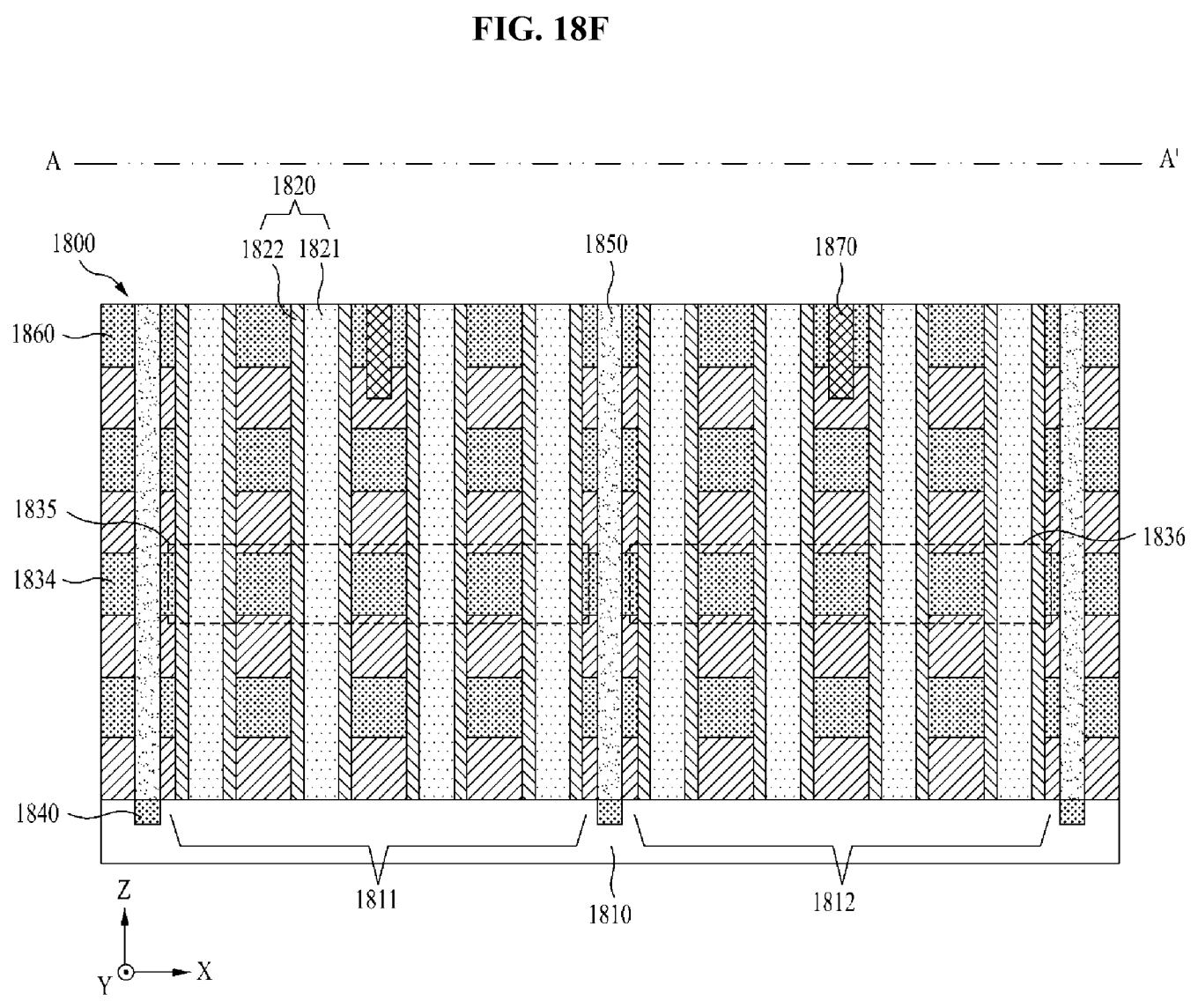

In this case, the manufacturing system may form the at least one SSL separation slit 1870 through a process similar to the formation of the at least one word line separation slit 1850. For example, the manufacturing system may form an inner space of the at least one SSL separation slit 1870 having a shape of a hollow trench or hole as shown in FIG. 18E, and then, may fill the inner space with an insulating film as shown in FIG. 18F to form the at least one SSL separation slit 1870.

As described above, although the at least one buried source line 1840 and the plurality of word lines 1834 have been described as being formed through different operations (processes), the at least one buried source line 1840 and the plurality of word lines 1834 may be collectively formed through the same operation (process).

For example, the manufacturing system may prepare the semiconductor structure 1800 including at least one buried sacrificial line instead of the at least one buried source line 1840 in operation S1710, and may remove the plurality of sacrificial layers 1830 and the at least one buried sacrificial line through the at least one word line separation slit 1850 in operation S1720. To this end, the at least one word line separation slit 1850 may be located above the at least one buried sacrificial line. Then, in operation S1730, the manufacturing system may inject a conductive material into a space from which the plurality of sacrificial layers 1830 are removed and a space from which the at least one buried sacrificial line is removed through the at least one word line separation slit 1850, respectively, thereby simultaneously forming the plurality of word lines 1834 and the at least one buried source line 1840.

Figure 19A:
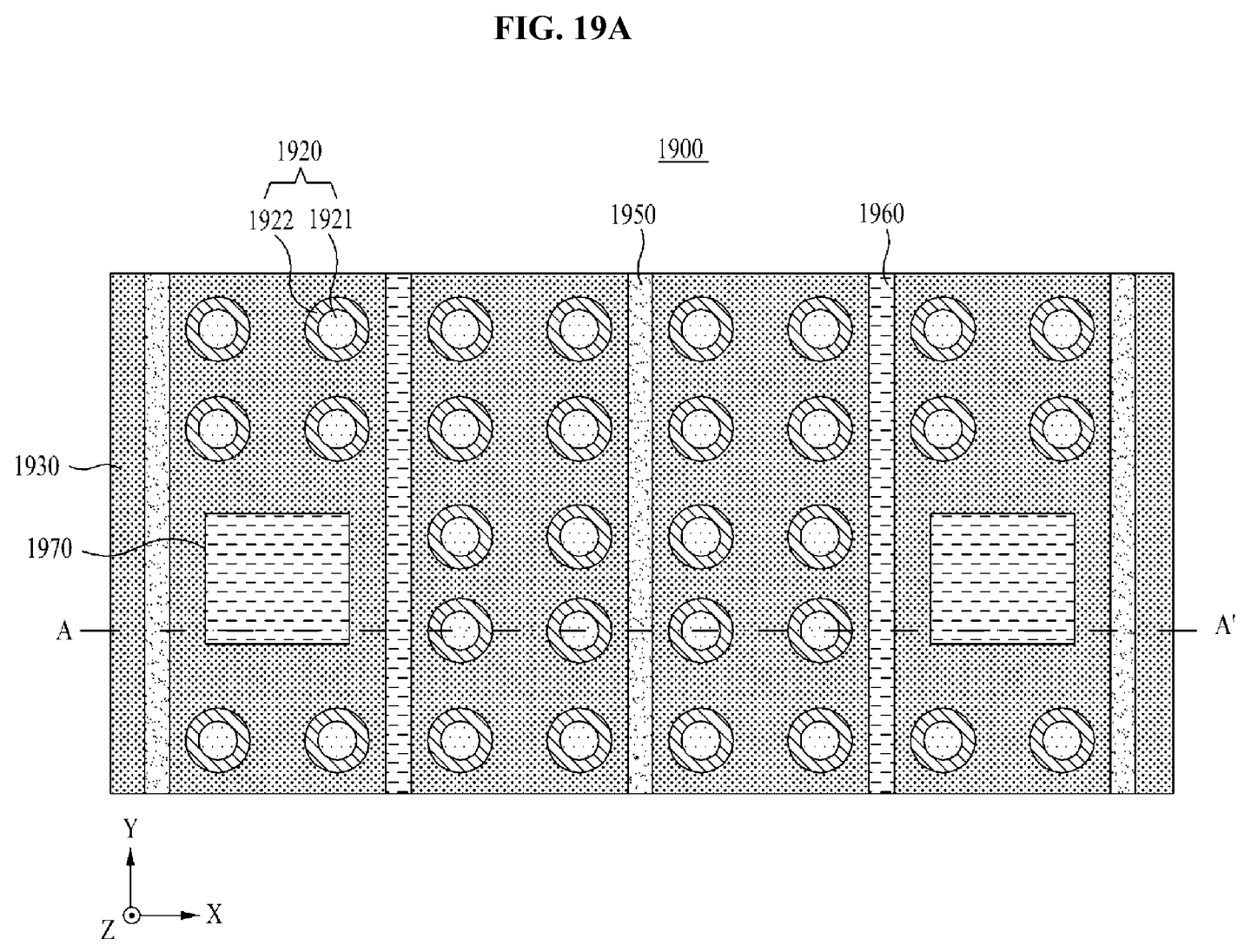
Figure 19B:
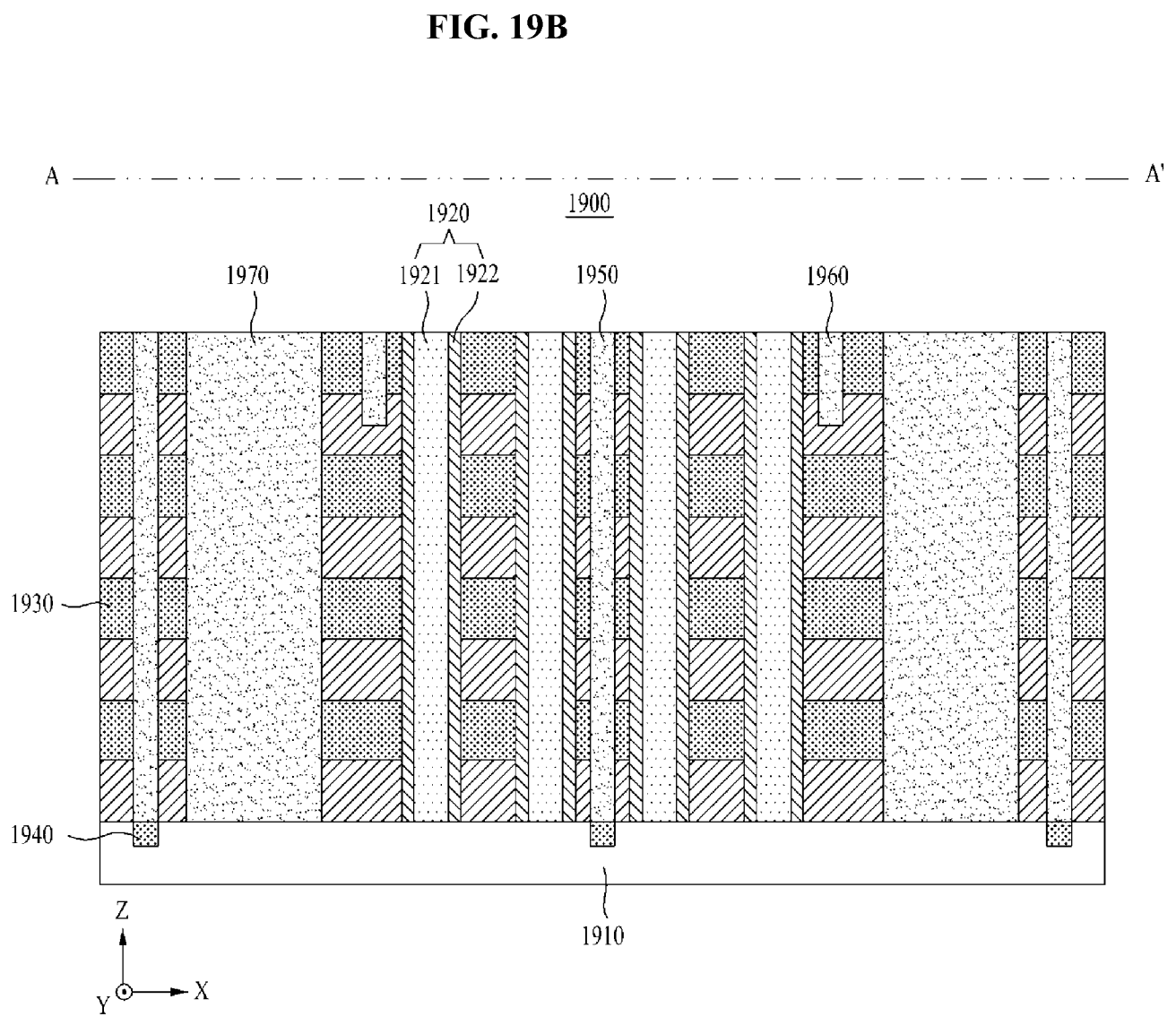

FIG. 19A is an X-Y plan view illustrating a 3D flash memory according to another embodiment. FIG. 19B is an X-Z cross-sectional view illustrating a 3D flash memory according to another embodiment.

Referring to FIGS. 19A to 19B, a 3D flash memory 1900 according to another embodiment includes the same components as the 3D flash memory 1600 described with reference to FIG. 16, such as a substrate 1910, a plurality of memory cell strings 1920, a plurality of word lines 1930, at least one buried source line 1940, at least one word line separation slit 1950, and at least one SSL separation slit 1960, but is different only in that a pattern 1970 for forming at least one word line is further included.

The pattern 1970 for forming at least one word line may extend in a direction perpendicular to the plurality of word lines 1930 to be used as a passage through which a conductive material forming the plurality of word lines 1930 is inserted. To this end, the pattern 1970 for forming at least one word line may have a depth corresponding to a region corresponding to the plurality of word lines 1930, may extend in a direction perpendicular to the plurality of word lines 1930, and may be disposed at an arbitrary location on the plane of the 3D flash memory 1900.

As the pattern 1970 for forming at least one word line is included in such a manner, the at least one word line separation slit 1950 included in the 3D flash memory 1900 may not be used as a passage through which a conductive material for forming the plurality of word lines 1930 is inserted.

FIG. 20 is a flowchart illustrating a method of manufacturing a 3D flash memory according to another embodiment. FIGS. 21A to 21F are X-Z cross-sectional views illustrating a method of manufacturing a 3D flash memory according to another embodiment. Hereinafter, the manufacturing method described with reference to FIGS. 20 and 21A to 21F is for manufacturing the 3D flash memory 1900 described in FIGS. 19A and 19B, and is assumed to be performed by an automated and mechanized manufacturing system.

Figure 21A:
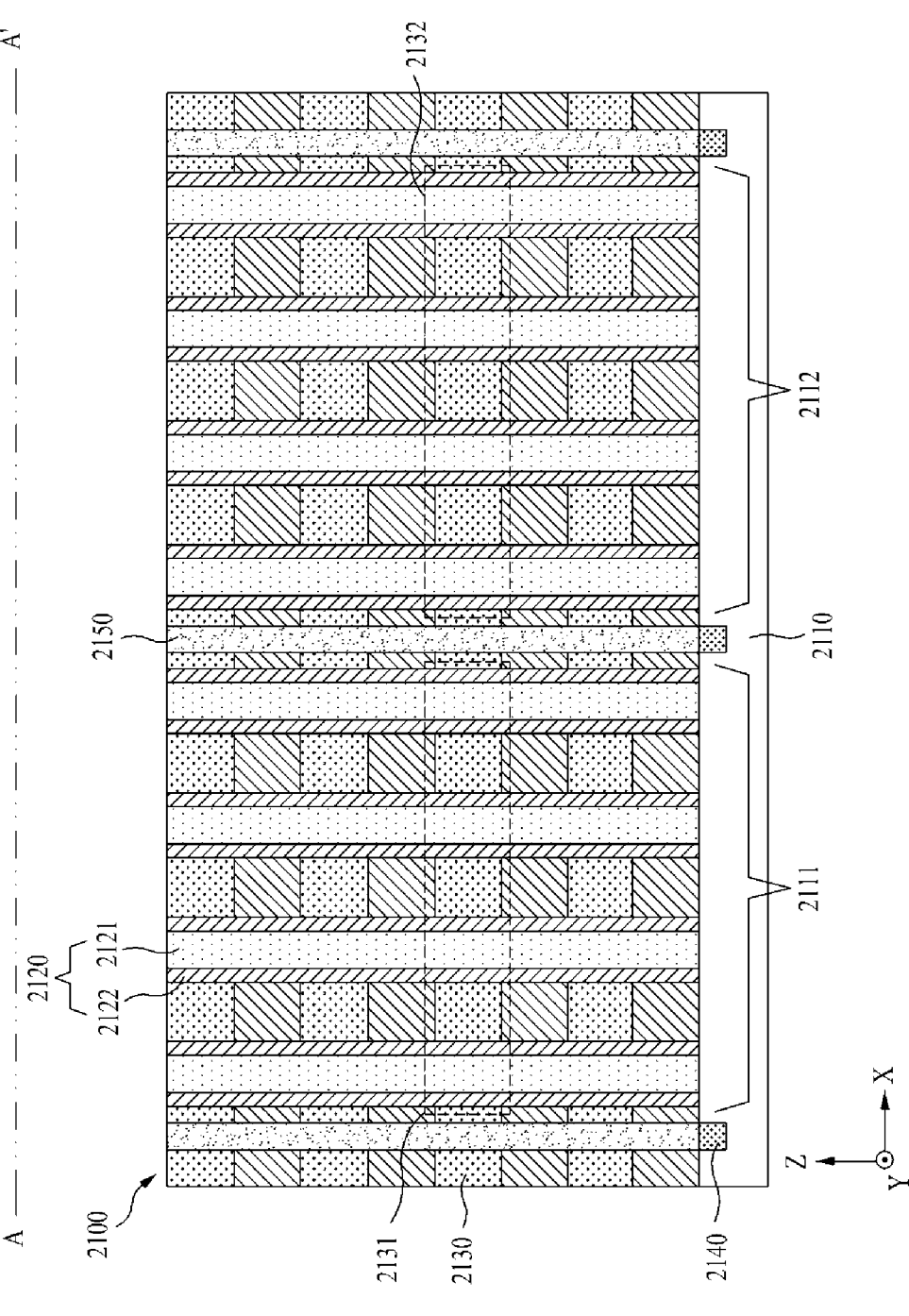

Referring to FIGS. 20 and 21A to 21F, in operation S2010, the manufacturing system prepares a semiconductor structure 2100 as shown in FIG. 21A. In this case, the semiconductor structure 2100 includes a plurality of memory cell strings 2120 each including a channel layer 2121 and a charge storage layer 2122 extending in one direction on a substrate 2110, a plurality of sacrificial layers 2130 vertically connected to the plurality of memory cell strings 2120, at least one buried source line 2140 buried in the substrate 2110, and at least one word line separation slit 2150.

In preparing such a semiconductor structure 2100, the manufacturing system may form the at least one buried source line 2140 buried in the substrate 2110 with a conductive material that is distinct from the substrate 2110, and may connect the plurality of memory cell strings 2120 and the at least one buried source line 2140 through the substrate 2110 (more precisely, through wire (not shown) buried in the substrate 2110).

In this case, in burying and forming the at least one buried source line 2140, the manufacturing system may bury the at least one buried source line 2140 in the substrate 2110 to have a minimized width while satisfying the condition that the at least one buried source line 2140 may be used as a common source electrode by the plurality of memory cell strings 2120.

In addition, in preparing the semiconductor structure 2100, the manufacturing system may extend the at least one word line separation slit 2150 in a direction perpendicular to the plurality of sacrificial layers 2130 such that parts 2131 and 2132 separated from the plurality of sacrificial layers 2130 are spaced apart from each other by the plurality of memory blocks 2111 and 2112, thereby separating the plurality of sacrificial layers 2130.

In this case, because the at least one word line separation slit 2150 included in the semiconductor structure 1800 prepared in operation S2010 is not necessary to be used as a passage in operations S2030 to S2040 to be described later, the at least one word line separation slit 2150 may be formed in a shape in which an inner space is filled with an insulating film.

Figure 21B:
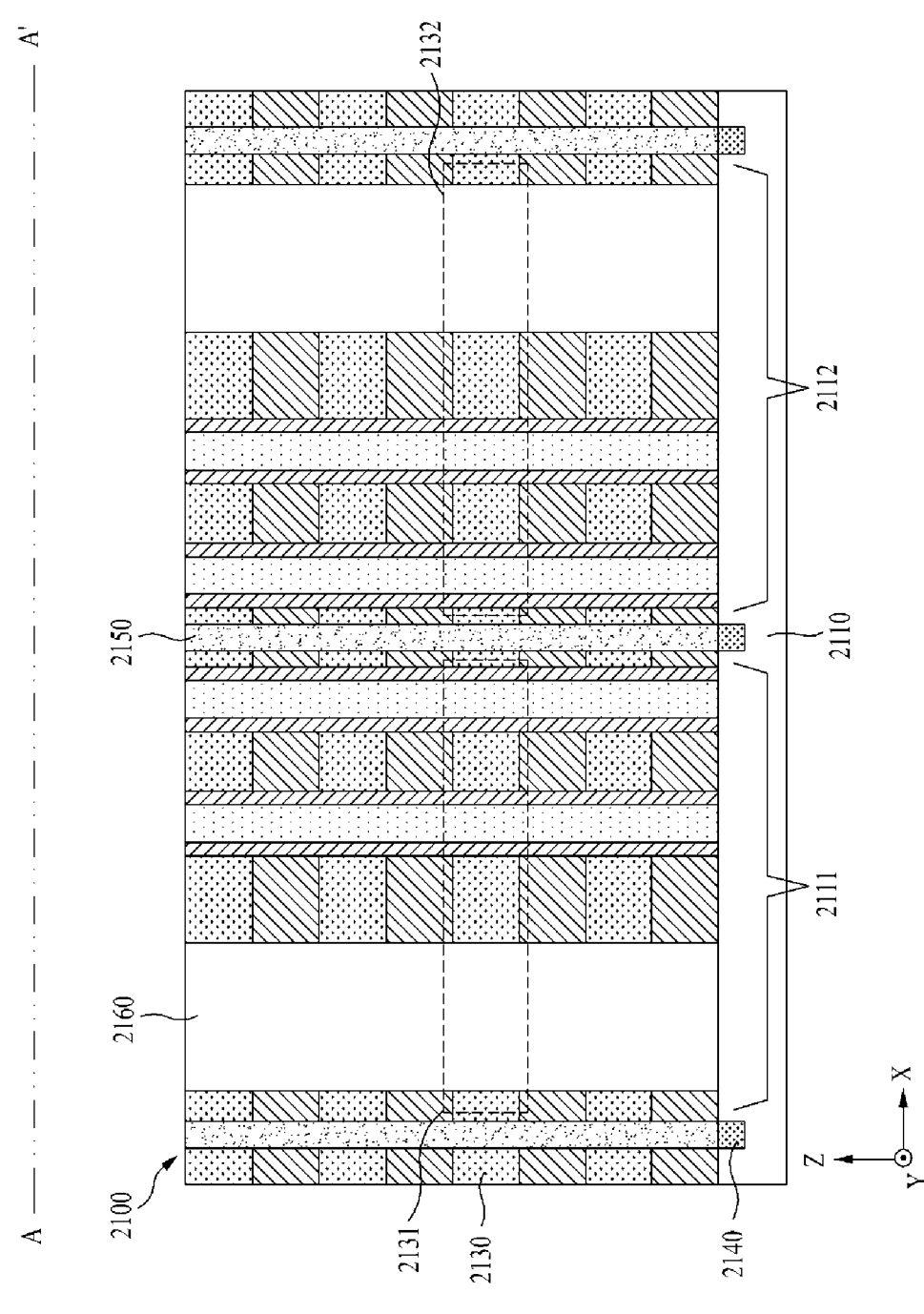

Next, in operation S2020, the manufacturing system extends at least one word line forming pattern 2160 in a direction perpendicular to the plurality of sacrificial layers 2130 in the semiconductor structure 2100, as shown in FIG. 21B. Because the at least one word line forming pattern 2160 should be used as a passage in operation S2030 to S2040 to be described later, the at least one word line forming pattern 2160 may have the shape of a hollow trench or hole.

Figure 21C:
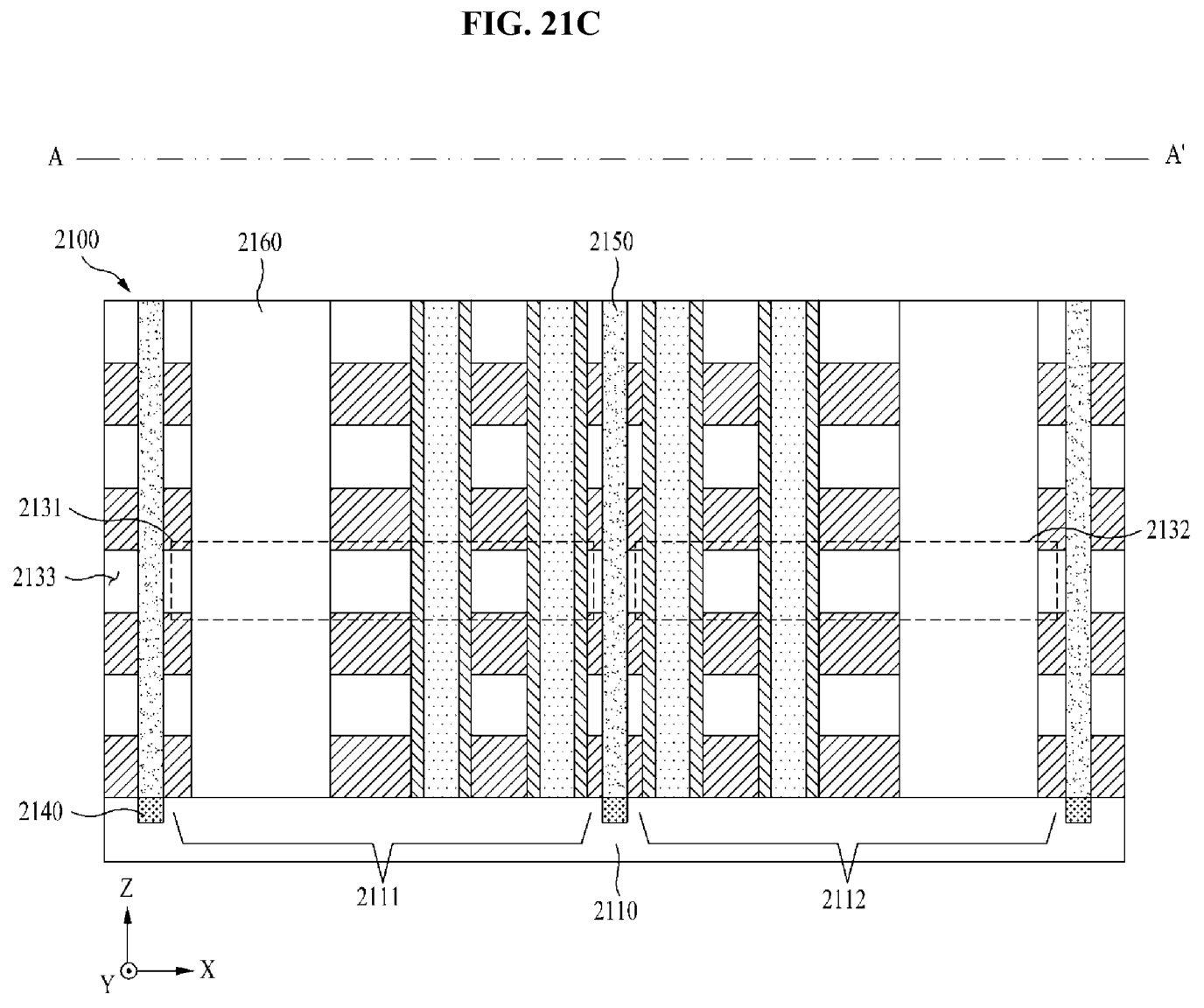

Next, as shown in FIG. 21C, in operation S2030, the manufacturing system removes the plurality of sacrificial layers 2130 through the at least one word line forming pattern 2160.

Figure 21D:
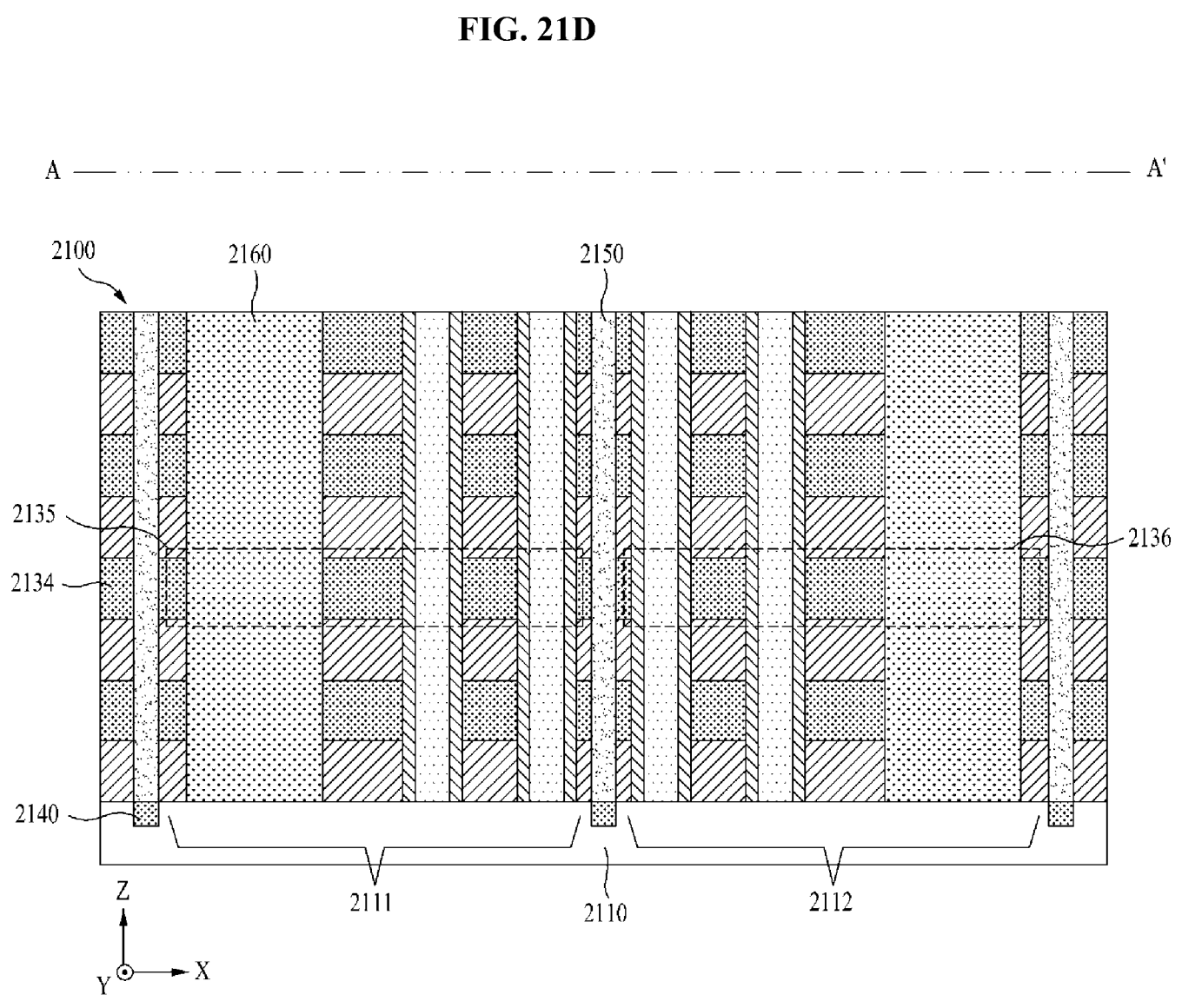

Next, in operation S2040, the manufacturing system uses the at least one word line forming pattern 2160 to form the plurality of word lines 2134 in the space 2133 from which the plurality of sacrificial layers 2130 are removed. For example, as shown in FIG. 21D, the manufacturing system may insert a conductive material into the space 2133 from which the plurality of sacrificial layers 2130 are removed by using the at least one word line forming pattern 2160 as a passage, thereby forming the plurality of word lines 2134.

In this case, as the at least one word line separation slit 2150 has a structure for separating the plurality of sacrificial layers 2130 in operation S2010 of preparing the semiconductor structure 2100, the plurality of word lines 2134 may be separated after operation S2140 of forming the plurality of word lines 2134 is performed. That is, the at least one word line separation slit 2150 may extend in a direction perpendicular to the plurality of word lines 2134 such that parts 2135 and 2136 separated from the plurality of word lines 2134 are spaced apart from each other by the plurality of memory blocks 2111 and 2112, thereby separating the plurality of word lines 2134.

In addition, in operation S2040, the manufacturing system may fill an empty inner space of the at least one word line forming pattern 2160 with an insulating film after forming the plurality of word lines 2134.

In addition, although not shown as a separate operation in the flowchart shown in FIG. 20, after operation S2040, the manufacturing system may form at least one SSL separation slit 2180 separating at least one SSL 2170 located on the upper end of the plurality of word lines 2134. Specifically, the manufacturing system may extend the at least one SSL separation slit 2180 in a direction perpendicular to the at least one SSL 2170 such that parts 2171 and 2172 separated from the at least one SSL 2170 are spaced apart from each other in each of the plurality of memory blocks 2111 and 2112, thereby separating the at least one SSL 2170.

Figure 21E:
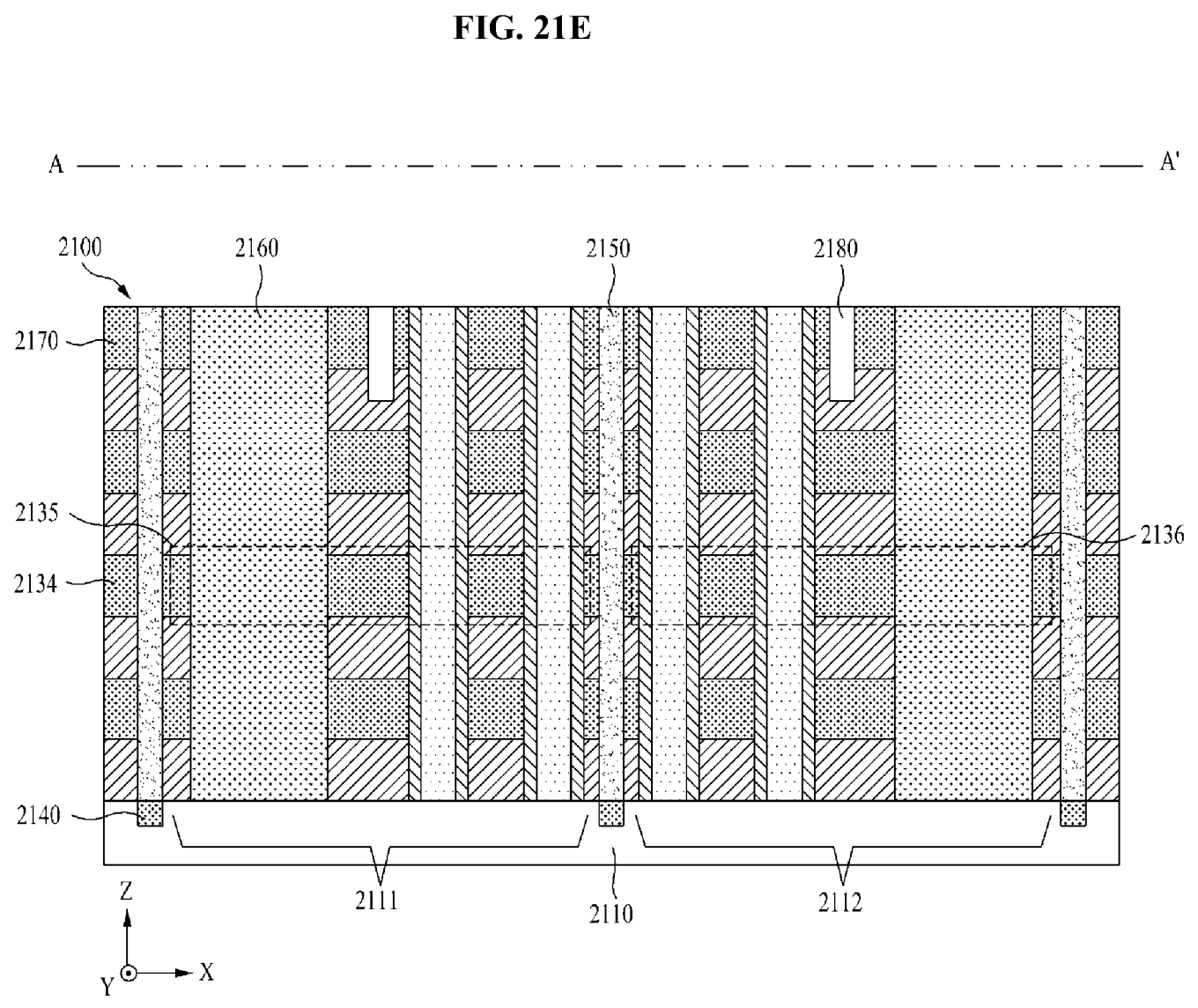
Figure 21F:
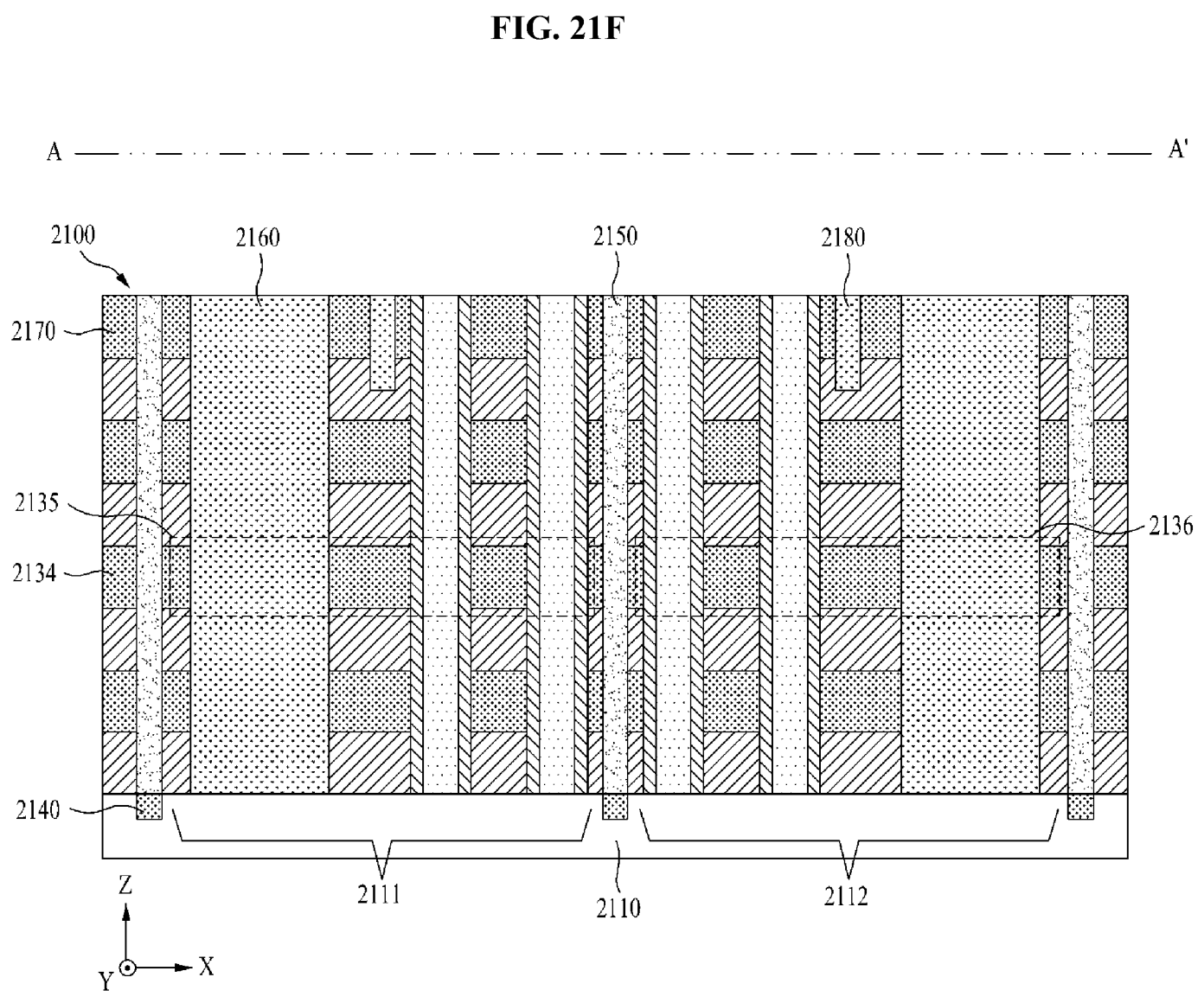

In this case, the manufacturing system may form the at least one SSL separation slit 2180 through a process similar to the formation of the at least one word line separation slit 2150. For example, the manufacturing system may form an inner space of the at least one SSL separation slit 2180 having a shape of a hollow trench or hole as shown in FIG. 21E, and then, may fill the inner space with an insulating film as shown in FIG. 21F to form the at least one SSL separation slit 2180.

As described above, although the at least one buried source line 2150 and the plurality of word lines 2134 have been described as being formed through different operations (processes), the at least one buried source line 750 and the plurality of word lines 734 may be collectively formed through the same operation (process).

For example, the manufacturing system may prepare the semiconductor structure 2100 including at least one buried sacrificial line instead of the at least one buried source line 2150 in operation S2010, and may remove the plurality of sacrificial layers 2130 and the at least one buried sacrificial line through the at least one word line forming pattern 2160 in operation S2030. To this end, the at least one word line forming pattern 2160 may be located above the at least one buried sacrificial line. Then, in operation S2040, the manufacturing system may inject a conductive material into a space from which the plurality of sacrificial layers 2130 are removed and a space from which the at least one buried sacrificial line is removed through the at least one word line forming pattern 2160, respectively, thereby simultaneously forming the plurality of word lines 2134 and the at least one buried source line 2140.

In addition, it has been described above that the at least one word line forming pattern 2160 is formed after the at least one word line separation slit 2150 is formed, but the embodiment is not limited thereto and the at least one word line separation slit 2150 may be formed after the at least one word line forming pattern 2160 is formed.

For example, after preparing the semiconductor structure 2100 in which the at least one word line separation slit 2150 is not formed in operation S2010 and performs operations S2120 to S2140, the manufacturing system may form the at least one word line separation slit 2150 and at least one SSL separation slit 2180.

While a few exemplary embodiments have been shown and described with reference to the accompanying drawings, it will be apparent to those skilled in the art that various modifications and variations can be made from the foregoing descriptions. For example, adequate effects may be achieved even if the foregoing processes and methods are carried out in different order than described above, and/or the aforementioned elements, such as systems, structures, devices, or circuits, are combined or coupled in different forms and modes than as described above or be substituted or switched with other components or equivalents.

Thus, it is intended that the present disclosure covers other realizations and other embodiments of the present disclosure provided they come within the scope of the appended claims and their equivalents.

The invention claimed is:

1. A three-dimensional flash memory to which an efficient word line connection structure is applied, the three-dimensional flash memory comprising:
   at least one memory cell string extending in one direction;
   a plurality of word lines vertically connected to the at least one memory cell string; and
   a row decoder located below the plurality of word lines,
   wherein each of the plurality of word lines is connected to the row decoder through a plug via connected to a contact of each of the plurality of word lines,
   wherein a plurality of connection wires connecting the plug via of each of the plurality of word lines to the contact of each of the plurality of word lines are arranged in a plane of the plurality of word lines,
   wherein the plurality of connection wires include a vertical portion and a horizontal portion, and wherein, on the plane of the plurality of word lines, a position of each plug via and a position of each contact are configured to minimize a length of the horizontal portion of each of the plurality of connection wires.

2. The three-dimensional flash memory of claim 1, wherein the plug via of each of the plurality of word lines passes through each of the plurality of word lines on a plane of the plurality of word lines and contacts the row decoder.

3. The three-dimensional flash memory of claim 2, wherein the plug via of each of the plurality of word lines has a structure that is isolated from each of the plurality of word lines on the plane.

4. The three-dimensional flash memory of claim 3, wherein the plug via of each of the plurality of word lines is isolated from each of the plurality of word lines on a plane by an oxide layer formed between the plurality of word lines.

5. A three-dimensional flash memory having a structure for efficient layout, the three-dimensional flash memory comprising:
   at least one cell block each including a plurality of memory cell strings extending on a substrate in one direction;
   a plurality of peripheral circuit blocks, each including at least one peripheral circuit and located below the at least one cell block as a cell on peripheral (COP) structure is applied;
   a row decoder for the at least one cell block and the plurality of peripheral circuit blocks; and
   a column decoder for the at least one cell block and the plurality of peripheral circuit blocks,
   wherein the row decoder and the column decoder are arranged while dividing the plurality of peripheral circuit blocks such that the plurality of peripheral circuit blocks are symmetrical to each other.

6. The three-dimensional flash memory of claim 5, wherein the row decoder and the column decoder are arranged in a cross shape in a plane of the three-dimensional flash memory to symmetrically divide the plurality of peripheral circuit blocks into quadrants formed by the cross shape.

7. The three-dimensional flash memory of claim 6, wherein the row decoder and the column decoder are arranged in the cross shape as the row decoder is located in a vertical direction and the column decoder is located in a horizontal direction across a midpoint of the row decoder in the plane of the 3D flash memory.

8. The three-dimensional flash memory of claim 5, wherein the row decoder and the column decoder are arranged in a T-shape in a plane of the three-dimensional flash memory and symmetrically divide the plurality of peripheral circuit blocks into two quadrants formed by the T-shape.

9. The three-dimensional flash memory of claim 8, wherein the row decoder and the column decoder are arranged in the T-shape as the column decoder is located in a horizontal direction and the row decoder is located in a vertical direction from a midpoint of the column decoder to one point in the plane of the three-dimensional flash memory.

* * * * *